(12) United States Patent
Yonamoto

(10) Patent No.: US 8,053,826 B2
(45) Date of Patent: Nov. 8, 2011

(54) NON-VOLATILE SEMICONDUCTOR MEMORY DEVICE AND METHOD OF MANUFACTURING THE SAME

(75) Inventor: Yoshiki Yonamoto, Oyama (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/602,154

(22) PCT Filed: Sep. 10, 2007

(86) PCT No.: PCT/JP2007/067570
§ 371 (c)(1),
(2), (4) Date: Nov. 29, 2009

(87) PCT Pub. No.: WO2009/034605
PCT Pub. Date: Mar. 19, 2009

(65) Prior Publication Data
US 2010/0176439 A1    Jul. 15, 2010

(51) Int. Cl.
*H01L 29/792* (2006.01)
(52) U.S. Cl. ............... 257/324; 257/325; 257/E29.309; 257/E21.423; 438/287
(58) Field of Classification Search .............. 257/324, 257/325, E29.309, E21.423; 438/287
See application file for complete search history.

(56) References Cited

U.S. PATENT DOCUMENTS

| 6,207,506 B1 | 3/2001 | Yi et al. |
| 6,372,578 B1 * | 4/2002 | Muramatsu .................. 438/264 |
| 2002/0055230 A1 * | 5/2002 | Chang .......................... 438/258 |

FOREIGN PATENT DOCUMENTS

| JP | 06-209009 A | 7/1994 |
| JP | 06-291330 A | 10/1994 |
| JP | 8340056 A | 12/1996 |
| JP | 09-148325 A | 6/1997 |
| JP | 10-321740 A | 12/1998 |
| JP | 2000-77546 A | 3/2000 |
| JP | 2001-135735 | 5/2001 |
| JP | 2002-353343 A | 12/2002 |

* cited by examiner

*Primary Examiner* — Tu-Tu Ho
(74) *Attorney, Agent, or Firm* — Miles & Stockbridge P.C.

(57) ABSTRACT

The charge retention characteristics of a non-volatile memory, particularly, a MONOS-type non-volatile memory is improved. In a non-volatile memory cell including a tunnel silicon oxide film (107), a silicon nitride film (104) serving as a charge storage film, a silicon oxide film (105), and a gate electrode (108) which are sequentially formed on a semiconductor substrate, the tunnel silicon oxide film (107) has a stacked structure of a silicon oxynitride film (102) and a silicon oxide film (103). Herein, it is configured such that a density of nitrogen atoms contained in the silicon oxynitride film (102) decreases as a distance from an interface with the semiconductor substrate increases in a film-thickness direction of the silicon oxynitride film (102).

6 Claims, 12 Drawing Sheets

|  | THICKNESS OF INSUFFICIENT OXYGEN FILM (nm) |
|---|---|
| 301 | 0.8 |
| 302 | 2.0 |
| 303 | 1.2 |

# NON-VOLATILE SEMICONDUCTOR MEMORY DEVICE AND METHOD OF MANUFACTURING THE SAME

TECHNICAL FIELD

The present invention relates to a non-volatile semiconductor memory device capable of electrically rewriting information and a manufacturing technique of the same, and, more particularly relates to a MONOS (Metal Oxide Nitride Oxide Semiconductor) type transistor and a technique effectively employed to manufacturing the same.

BACKGROUND ART

Japanese Patent Application Laid-Open Publication No. 09-148325 (Patent Document 1) discloses techniques capable of obtaining a silicon oxynitride film excellent in in-plane film thickness uniformity and electrical characteristics. Specifically, a semiconductor substrate is subjected to a thermal treatment, thereby forming a silicon oxide film on the semiconductor substrate (oxidation step); and then, the silicon oxide film is nitrided by a thermal treatment using ammonia (NH3), thereby forming a silicon oxynitride film (nitridation). Subsequently, a thermal treatment using nitrogen monoxide is carried out, thereby removing hydrogen contained in the silicon oxynitride film (dehydrogenation).

In Japanese Patent Application Laid-Open Publication No. 2000-77546 (Patent Document 2), a silicon oxide film is formed on a semiconductor substrate. Then, a thermal treatment is carried out in an atmosphere of nitrogen monoxide, thereby forming a first silicon oxynitride region A and a second silicon oxynitride region B which contains a relatively smaller amount of nitrogen than the first silicon oxynitride region A.

In Japanese Patent Application Laid-Open Publication No. 06-209009 (Patent Document 3), a method of forming a silicon oxynitride film which is expected to be used as an alternative for a silicon oxide film is described. Specifically, a technique of forming the silicon oxynitride film by nitriding the surface of a silicon substrate, then forming a silicon oxide film thereon, and densifying the silicon oxide film is described.

In Japanese Patent Application laid-Open Publication No. 06-291330 (Patent Document 4), a technique below is described. Specifically, a semiconductor substrate is subjected to a thermal treatment at a temperature of 950° C. and in a nitrogen-diluted oxygen atmosphere, thereby forming a silicon oxide film on the semiconductor substrate. Then, the silicon oxide film is nitrided in an ammonia atmosphere at 1000° C., thereby forming a silicon oxynitride film between the silicon oxide film and the semiconductor substrate.

Patent Document 1: Japanese Patent Application Laid-Open Publication No. H09-148325
Patent Document 2: Japanese Patent Application Laid-Open Publication No. 2000-77546
Patent Document 3: Japanese Patent Application Laid-Open Publication No. H06-209009
Patent Document 4: Japanese Patent Application Laid-Open Publication No. H06-291330

DISCLOSURE OF THE INVENTION

Problems to be Solved by the Invention

For example, a floating-type non-volatile memory is used as a rewritable non-volatile memory. This floating-type non-volatile memory has a lower insulating film, which is formed on a silicon substrate (semiconductor substrate), and a floating gate electrode, which is formed on the lower insulating film. In addition, the floating-type non-volatile memory has a structure in which an upper insulating film is formed on the floating gate electrode, and a gate electrode (control gate electrode) is formed on the upper insulating film.

In the floating-type non-volatile memory, for example, the floating gate electrode is formed of an electrically-conductive polysilicon film, and electric charge is accumulated (stored) in or discharged from the polysilicon film so as to write or erase information. In a written state, electrons are injected into the polysilicon film, which constitutes the floating gate electrode; however, if a leakage path exists somewhere in a part of the lower insulating film or the upper insulating film surrounding the polysilicon film, all the electric charge accumulated in the polysilicon film could be discharged due to abnormal leakage since the polysilicon film is an electrically conductive film. Thus, in the floating-type non-volatile memory, a problem may occur in the reliability of the charge retention characteristics.

Therefore, development of a MONOS-type non-volatile memory has been underway as an alternative for the floating-type non-volatile memory. In the MONOS-type non-volatile memory, a lower insulating film is formed on a silicon substrate (semiconductor substrate), and a charge storage film is formed on the lower insulating film. In addition, the MONOS-type non-volatile memory has a structure in which an upper insulating film is formed on the charge storage film, and a gate electrode is formed on the upper insulating film.

In the MONOS-type non-volatile memory, generally, silicon oxide films are used as the lower insulating film and the upper insulating film. The lower insulating film is referred to as a tunnel silicon oxide film, and the upper insulating film is referred to as a silicon gate insulating film. Moreover, in the MONOS-type non-volatile memory, an insulating film having a trap level such as a silicon nitride film is used as the charge storage film. Herein, the silicon gate electrode (upper insulating film) has the potential of a barrier that is sufficient to block carriers (charges) from the gate electrode.

Different from the floating-type non-volatile memory, the MONOS-type non-volatile memory has a structure in which charges are retained by discrete trap levels in the silicon nitride film, and outflow of the charges from the silicon nitride film is prevented by a barrier of the tunnel silicon oxide film. When charges are accumulated in the discrete trap levels in the silicon nitride film in this manner, the charge retention characteristics can be improved. Therefore, even if a leakage path is generated in part of the lower insulating film or the upper insulating film surrounding the silicon nitride film, which is the charge storage film, not all the electric charges is discharged from the silicon nitride film, since the electric charge is accumulated in the discrete trap levels of the silicon nitride film. Therefore, the reliability of data retention can be improved. Herein, the charge retention characteristics represent the characteristics of retaining data written to the MONOS-type non-volatile memory, that is, the charges injected into the silicon nitride film, which is the charge storage film.

However, the MONOS-type non-volatile memory is known for a deterioration phenomenon, in which the charge retention characteristics are deteriorated when driving (write operations and/or erase operations) is repeated; and, investigations for the cause of this deterioration phenomenon have been underway. Hereinafter, one mechanism of the deterioration of the charge retention characteristics, which is caused when the driving is repeated in the MONOS-type non-volatile memory, will be explained.

When driving (write operation or erase operation) of the MONOS-type non-volatile memory is carried out, electrons or holes pass through the tunnel silicon oxide film. Therefore, the tunnel silicon oxide film is damaged, and defects are formed in the tunnel silicon oxide film. Then, the charges accumulated in the silicon nitride film, which is the charge storage film, are discharged to the silicon substrate via the defects (defect level, trap level) formed in the tunnel silicon oxide film. In this manner, the retention characteristics of the charges accumulated in the silicon nitride film is deteriorated. In order to suppress the deterioration of the charge retention characteristics, generation of the defects in the tunnel silicon oxide film has to be reduced; however, the method thereof has not been established yet, and this is a big problem for improvement of the charge retention characteristics of the MONOS-type non-volatile memory.

It is a preferred aim of the present invention to provide a technique capable of improving the charge retention characteristics of a non-volatile memory, particularly, a MONOS-type non-volatile memory.

The above and other preferred aims and novel characteristics of the present invention will be apparent from the description of this specification and the accompanying drawings.

Means for Solving the Problems

The typical ones of the inventions disclosed in this application will be briefly described as follows.

A non-volatile semiconductor memory device according to the present invention relates to a MONOS-type non-volatile memory having: (a) a semiconductor substrate; (b) a tunnel silicon oxide film formed on the semiconductor substrate; (c) a charge storage film formed on the tunnel silicon oxide film; (d) a gate insulating film formed on the charge storage film; (e) a gate electrode formed on the gate insulating film; and (f) a source region and a drain region formed in the semiconductor substrate and formed to be aligned with the gate electrode.

Also, a silicon oxynitride film is formed between the semiconductor substrate and the tunnel silicon oxide film; and a density of nitrogen atoms contained in the silicon oxynitride film decreases as the distance from an interface of the semiconductor substrate increases in a film-thickness direction of the silicon oxynitride film.

According to a typical embodiment describing such a configuration, an oxygen-deficient film which is formed in a region of the tunnel silicon oxide film in contact with the semiconductor substrate and has stoichiometrically deficient oxygen is substituted with the silicon oxynitride film; as a result, generation of defects can be suppressed. More specifically, the oxygen-deficient film is a film that is inevitably formed when the tunnel silicon oxide film is formed on the semiconductor substrate, and many defects are formed in the oxygen-deficient film. Therefore, generation of the defects can be suppressed by replacing the oxygen-deficient film by the silicon oxynitride film in which fewer defects are formed than the oxygen-deficient film. Furthermore, according to a typical embodiment, the density of the nitrogen atoms contained in the silicon oxynitride film decreases as the distance from the interface of the semiconductor substrate increases in the film-thickness direction of the silicon oxynitride film. As a result, the oxygen-deficient film being present at the interface of the semiconductor substrate can be sufficiently substituted with the silicon oxynitride film, and, at the same time, replacement of the silicon oxide film being present above the oxygen-deficient film by the silicon oxynitride film can be suppressed. More specifically, the silicon oxynitride film has a defect density smaller than that of the oxygen-deficient film, but has a defect density larger than that of the silicon oxide film. Therefore, when it is configured such that the density of the nitrogen atoms contained in the silicon oxynitride film decreases as the distance from the interface of the semiconductor substrate increases in the film-thickness direction of the silicon oxynitride film, the defect density can be reduced by replacing the oxygen-deficient film being present at the interface of the semiconductor substrate by the silicon oxynitride film, and an increase in the defect density due to replacing the silicon oxide film by the silicon oxynitride film can be suppressed. As a result, the charge retention characteristics of the MONOS-type non-volatile memory can be improved.

In addition, a method of manufacturing a non-volatile semiconductor memory device according to the present invention includes the steps of: (a) forming a tunnel silicon oxide film on a semiconductor substrate; (b) converting a part of the tunnel silicon oxide film in contact with the semiconductor substrate to a silicon oxynitride film after the step (a); (c) forming a charge storage film on the tunnel silicon oxide film; (d) forming a gate insulating film on the charge storage film; (e) forming a conductive film on the gate insulating film; (f) forming a gate electrode by patterning the conductive film and processing the gate insulating film, the charge storage film, the tunnel silicon oxide film, and the silicon oxynitride film in conformity with the gate electrode; and (g) forming a source region and a drain region in the semiconductor substrate so as to be aligned with the gate electrode. Here, the step (b) includes the steps of: (b1) introducing nitrogen atoms into an interface of the semiconductor substrate and the tunnel silicon oxide film; and (b2) diffusing the nitrogen atoms in the film-thickness direction of the tunnel silicon oxide film to form the silicon oxynitride film after the step (b1).

In a typical embodiment having such a configuration, the nitrogen atoms can be introduced into the interface of the semiconductor substrate and the tunnel silicon oxide film at the step (b1); therefore, as well as suppressing nitridation of the surface of the tunnel silicon oxide film, the nitrogen atoms can be localized at the interface of the semiconductor substrate. Then, after this, the step (b2) is carried out, thereby diffusing the nitrogen atoms from the state of being localized at the interface of the semiconductor substrate to form the silicon oxynitride film. Therefore, it is configured such that the density of the nitrogen atoms contained in the silicon oxynitride film decreases as the distance from the interface of the semiconductor substrate increases in the film-thickness direction of the silicon oxynitride film. Consequently, the oxygen-deficient film being present at the interface of the semiconductor substrate can be sufficiently substituted with the silicon oxynitride film, meanwhile, substitution of the silicon oxide film (part of the tunnel silicon oxide film), which is present above the oxygen-deficient film, with the silicon oxynitride film can be suppressed.

EFFECTS OF THE INVENTION

The effects obtained by typical elements of the invention disclosed in the present application are simply explained below.

In the MONOS-type non-volatile memory, the oxygen-deficient film being present between the tunnel silicon oxide film and the semiconductor substrate is nitrided to be replaced with the silicon oxynitride film; as a result, generation of defects caused by rewriting operations of the MONOS-type non-volatile memory can be suppressed. Particularly, by a configuration having the density of the nitrogen atoms contained in the silicon oxynitride film being decreased as the distance from the interface of the semiconductor substrate increases in the film-thickness direction of the silicon oxynitride film, the oxygen-deficient film being present at the interface of the semiconductor substrate can be substituted with the silicon oxynitride film so that the density of defects is reduced, and an increase in the density of defects that is caused when the silicon oxide film is substituted with the silicon oxynitride film can be suppressed. In this manner, the charge retention characteristics of the MONOS-type non-volatile memory can be improved.

BRIEF DESCRIPTIONS OF THE DRAWINGS

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, components having the same function are denoted by the same reference symbols throughout the drawings for describing the embodiments, and the repetitive description thereof is omitted. Note that, in some drawings used in the embodiments, hatching is used even in a plan view so as to make the drawings easy to understand.

Hereinafter, a non-volatile memory according to a present embodiment will be specifically described with reference to the drawings.

Figure 1:
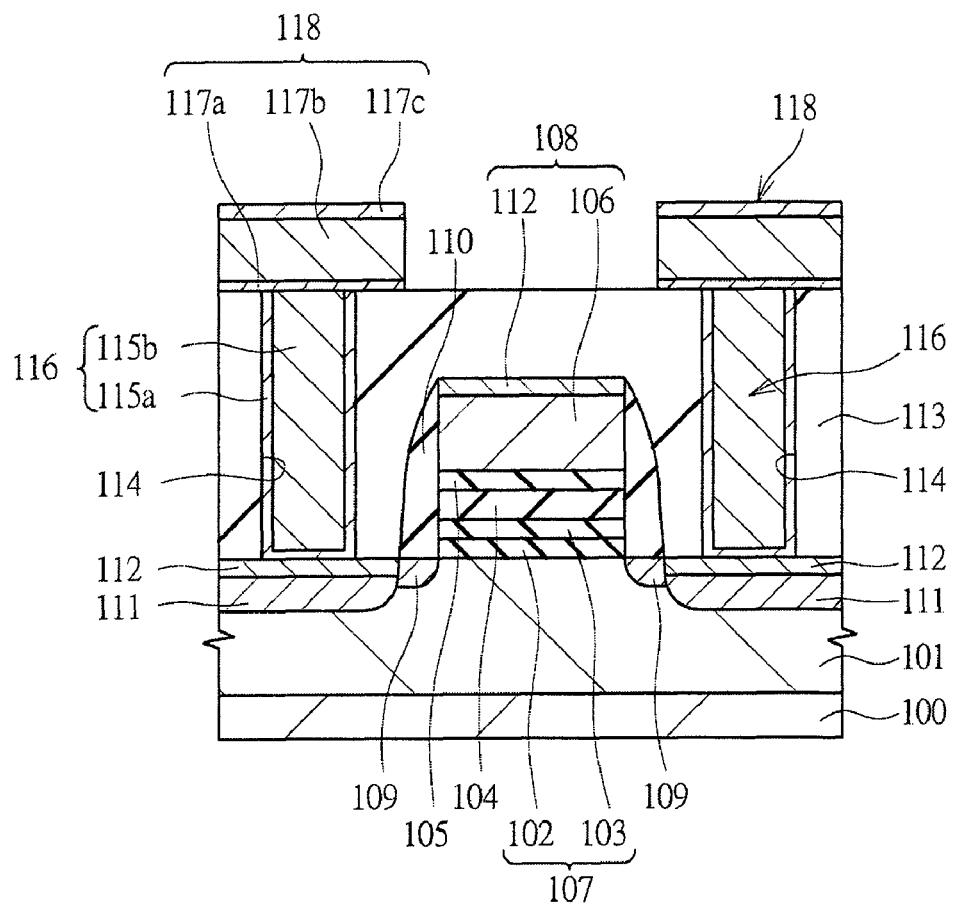
FIG. 1 is a cross-sectional view illustrating a structure of a non-volatile memory cell according to an embodiment of the present invention.

FIG. 1 is a cross-sectional view illustrating a structure of a non-volatile memory cell according to the present embodiment. In FIG. 1, in a semiconductor substrate (silicon substrate) 100, a p-type well 101 is formed by introducing a p-type impurity such as boron (boron, B). A silicon oxynitride film 102 is formed on the p-type well 101, and a silicon oxide film 103 is formed on the silicon oxynitride film 102. A tunnel silicon oxide film 107 is formed of the silicon oxynitride film 102 and the silicon oxide film 103.

A silicon nitride film 104, which serves as a charge storage film, is formed on the tunnel silicon oxide film 107, and a silicon oxide film 105 is formed on the silicon nitride film 104. In addition, a gate electrode 108 is formed on the silicon oxide film 105. The gate electrode 108 is configured by a polysilicon film 106 and a cobalt silicide film 112 formed on a surface of the polysilicon film 106. The cobalt silicide film 112 is formed for reducing the resistance of the gate electrode 108.

Sidewall spacers 110 are formed on the both sides of sidewalls of the stacked structure formed of the tunnel silicon oxide film 107 formed on the p-type well 101, the silicon nitride film 104, the silicon oxide film 105, and the gate electrode 108. In addition, a low-concentration n-type impurity diffusion region 109 is formed in the p-type well 101 below the sidewall spacer 110, and a high-concentration n-type impurity diffusion region 111 is formed outside the low-concentration n-type impurity diffusion region 109. The cobalt silicide film 112 for reducing resistance is formed on the surface of the high-concentration n-type impurity diffusion region 111.

The low-concentration n-type impurity diffusion region 109 and the high-concentration n-type impurity diffusion region 111 are semiconductor regions and are formed by implanting and diffusing therein an n-type impurity such as phosphorous or arsenic into the p-type well 101, and then activating the introduced n-type impurity. And, in the high-concentration n-type impurity diffusion region 111, the n-type impurity is introduced at a higher concentration than that of the low-concentration n-type impurity diffusion region 109.

A source region or a drain region of the non-volatile memory cell is formed by a pair of the low-concentration n-type impurity diffusion regions 109 and a pair of the high-concentration n-type impurity diffusion regions 111. When the source region and the drain region are formed by the low-concentration n-type impurity diffusion regions 109 and the high-concentration n-type impurity diffusion regions 111, the source region and the drain region can have an LDD (Lightly Doped Drain) structure.

In this manner, the non-volatile memory cell according to the present embodiment is formed. Subsequently, a wiring structure connected to the non-volatile memory cell will be described. A silicon oxide film 113, which is an interlayer insulating film, is formed on the non-volatile memory cell so as to cover the non-volatile memory cell. In the silicon oxide film 113, contact holes 114 which penetrate through the silicon oxide film 113 and reach the high-concentration impurity diffusion regions 111 (cobalt silicide film 112), which constitute the source region and the drain region, are formed. Inside the contact hole 114, a titanium/titanium nitride film 115a, which is a barrier conductive film, is formed, and a tungsten film 115b is formed so as to fill the contact hole 114. A plug 116 which is conductive is formed by embedding the titanium/titanium nitride film 115a and the tungsten film 115b in the contact hole 114 in this manner. In addition, wiring 118 is formed on the silicon oxide film 113, which is an interlayer insulating film, and the wiring 118 and the plug 116 are electrically connected to each other. The wiring 118 is formed of, for example, a stacked film of a titanium/titanium nitride film 117a, an aluminum film 117b, and a titanium/titanium nitride film 117c.

The non-volatile memory cell and the wiring are formed in the above described manner, and the non-volatile memory is configured by forming a plurality of the non-volatile memory cells on the semiconductor substrate 100.

Next, a detailed configuration of the non-volatile memory cell will be described. First, as illustrated in FIG. 1, the silicon nitride film 104 is formed on the tunnel silicon oxide film 107, and the silicon nitride film 104 functions as a charge storage film. That is, the silicon nitride film 104 has the function of accumulating (storing) charges. The non-volatile memory cell of the present embodiment stores information by controlling the current that flows in the semiconductor substrate 100 (p-type well 101) below the gate electrode 108 by the presence/absence of charges accumulated in the silicon nitride film 104, which is the charge storage film. In other words, information is stored by utilizing the fact that the threshold voltage of the current that flows in the semiconductor substrate 100 below the gate electrode 108 is changed by the presence/absence of charges accumulated in the silicon nitride film 104.

In the present embodiment, an insulating film having a trap level is used as the charge storage film. The silicon nitride film 104 is illustrated as an example of the insulating film having the trap level; however, it is not limited to the silicon nitride film 104, and, for example, an aluminum oxide film (alumina) may be used. When the insulating film having the trap level is used as the charge storage film, charge is trapped in the trap level formed in the insulating film. The charge is stored in the insulating film by trapping charges in the trap level in this manner.

Conventionally, a polysilicon film has been mainly used as a charge storage film. However, when the polysilicon film is used as the charge storage film, if a leakage path exists somewhere in a part of the silicon oxide film 103 or the silicon oxide film 105 surrounding the charge storage film, all the charges accumulated in the charge storage film may be discharged due to an abnormal leakage since the charge storage film is a conductive film.

Thus, the silicon nitride film 104, which is an insulator, has been used as the charge storage film. In this case, the charges that contribute to data storage are accumulated in the discrete trap levels being present in the silicon nitride film 104. Therefore, even if a leakage path is generated in a part of the silicon oxide film 103 or the silicon oxide film 105 surrounding the charge storage film, not all the charges is discharged from the silicon nitride film 104 since the charges are accumulated in the discrete trap levels of the silicon nitride film 104. Therefore, reliability of data retention can be improved.

For this reason, the reliability of data retention can be improved not only by using the silicon nitride film 104 but also by using a film including discrete trap levels as the charge storage film.

Subsequently, the configuration of the tunnel silicon oxide film 107, which is one of the features of the present embodiment, will be described. In the present embodiment, the silicon nitride film 104 is used as the charge storage film; and, charges are accumulated in the silicon nitride film 104 by, as is described later, injecting electrons into the silicon nitride film 104 from the semiconductor substrate 100 side via the tunnel silicon oxide film 107. That is, the electrons are injected into the silicon nitride film 104 via the tunnel silicon oxide film 107. Therefore, the tunnel silicon oxide film 107 has the function of allowing the electrons to pass through by, for example, the tunnel effect. Furthermore, the tunnel silicon oxide film has a function as a barrier film for preventing the electrons, which have been injected into the silicon nitride film 104, from flowing out to the semiconductor substrate 100. Similarly, the silicon oxide film 105 is formed on the silicon nitride film 104, and the silicon oxide film 105 also functions as a barrier film. More specifically, the gate electrode 108 is formed on the silicon oxide film 105, and the silicon oxide film 105 is provided as the barrier film for preventing an inflow of charges from the gate electrode 108.

In this manner, it can be understood that the tunnel silicon oxide film 107 has the function of allowing charges to pass through in order to accumulate the charges in the silicon nitride film 104, which is the charge storage film, and the function as the barrier film which prevents leakage of the charges, which are accumulated in the silicon nitride film 104, to the semiconductor substrate 100 side. These functions relate to the characteristics of the non-volatile memory cell and are important. Therefore, the characteristics of the tunnel silicon oxide film 107 have to be improved to improve the characteristics of the non-volatile memory cell.

In a conventional MONOS-type non-volatile memory cell, the tunnel silicon oxide film has been composed of a single layer silicon oxide film. However, in this case, the problem has become obvious that the charge retention characteristics of the non-volatile memory cell are deteriorated when the non-volatile memory cell is repeatedly driven (write operations and/or erase operations). When the cause of the problem was investigated, formation of many defects in the silicon oxide film, which constitutes the tunnel silicon oxide film, was supposed to be the cause. More specifically, when the MONOS-type non-volatile memory cell is driven (write operation and/or erase operation), electrons and/or holes pass through the tunnel silicon oxide film. Therefore, the tunnel silicon oxide film is damaged and defects are formed in the tunnel silicon oxide film. Then, the charges accumulated in the silicon nitride film, which is the charge storage film, are discharged to the silicon substrate via the defects (defect level, trap level) formed in the tunnel silicon oxide film. In this manner, the retention characteristics of the charges accumulated in the silicon nitride film is deteriorated.

As a result of further detailed study, it was found that, when a silicon oxide film is formed on the semiconductor substrate, an oxygen-deficient film in which oxygen is stoichiometrically deficient is formed at the interface with the semiconductor substrate, and a lot of defect levels are formed in this oxygen-deficient film. Thus, it was found out that the defect levels were formed in the oxygen-deficient film formed at the interface with the semiconductor substrate in the silicon oxide film, which constitutes the tunnel silicon oxide film, and that the charge retention characteristics of the non-volatile memory cell were deteriorated when charges are discharged from the silicon nitride film, which is the charge storage film, via the defect levels.

Therefore, it can be expected that the charge retention characteristics of the non-volatile memory cell can be improved by forming the silicon oxide film without forming the oxygen-deficient film having a high defect density. However, when a silicon oxide film is formed on a semiconductor substrate, due to the difference in lattice constants of the silicon constituting the semiconductor substrate and the silicon dioxide constituting the silicon oxide film, an oxygen-deficient film, in which oxygen is stoichiometrically deficient, is inevitably formed at the interface of the semiconductor substrate. Therefore, it is difficult to form a silicon oxide film on a semiconductor substrate without forming an oxygen-deficient film.

Therefore, in the present embodiment, as illustrated in FIG. 1, the tunnel silicon oxide film 107 is formed of a stacked film of the silicon oxynitride film 102 and the silicon oxide film 103. More specifically, the silicon oxynitride film 102 is formed to be in contact with the interface of the semiconductor substrate 100, and the silicon oxide film 103 is formed on the silicon oxynitride film 102. As a result, the oxygen-deficient film formed at the interface of the semiconductor substrate 100 can be substituted with the silicon oxynitride film 102.

The silicon oxynitride film 102 has a feature that the defect density thereof is lower than that of the oxygen-deficient film. Therefore, compared with the structure in which the oxygen-deficient film is formed at the interface of the semiconductor substrate 100, the density of the defects formed in the tunnel silicon oxide film 107 can be reduced and the charge retention characteristics of the non-volatile memory cell can be improved by employing the structure in which the silicon oxynitride film 102 is formed at the interface of the semiconductor substrate 100.

Herein, in the present embodiment, the tunnel silicon oxide film 107 is composed of the stacked film of the silicon oxynitride film 102 and the silicon oxide film 103; however, it can be considered to compose the tunnel silicon oxide film 107 only by a silicon oxynitride film. However, the silicon oxynitride film 102 has the property that the defect density thereof is higher than that of the silicon oxide film. Furthermore, although the tunnel silicon oxide film 107 has the function as the barrier film, the silicon oxynitride film 102 has the property that the height of the barrier of the silicon oxynitride film 102 is lower than that of the barrier of the silicon oxide film 103. Therefore, from the viewpoint of reducing the defect density and the viewpoint of ensuring a sufficiently-high barrier, using the silicon oxide film 103 is preferable, rather than using the silicon oxynitride film 102.

From the above reason, the silicon oxide film 103 is basically used as the tunnel silicon oxide film 107; however, when the silicon oxide film 103 is formed on the semiconductor substrate 100, it is problematic that the oxygen-deficient film is formed. Therefore, in order to eliminate the oxygen-deficient film, the silicon oxynitride film 102 is used. Thus, the silicon oxynitride film 102 having a film thickness at a level that is capable of replacing the oxygen-deficient film is satisfactory, and it is not desirable to form the film thickness more than necessary. According to the above reasons, in the present embodiment, it is configured such that the density of the nitrogen atoms contained in the silicon oxynitride film 102 decreased as the distance from the interface of the semiconductor substrate 100 increases in the film thickness direction of the silicon oxynitride film 102. In other words, it is configured such that the density of the nitrogen atoms at the interface of the semiconductor substrate 100 and the silicon oxynitride film 102 is larger than the density of the nitrogen atoms at the interface of the silicon oxynitride film 102 and the silicon oxide film 103.

As a result, the oxygen-deficient film being present at the interface of the semiconductor substrate 100 can be sufficiently substituted with the silicon oxynitride film 102; meanwhile, substitution of the silicon oxide film 103 being present above the oxygen-deficient film with the silicon oxynitride film 102 can be suppressed. More specifically, the silicon oxynitride film 102 has a defect density smaller than that of the oxygen-deficient film, but has a defect density larger than that of the silicon oxide film 103. Therefore, when make the configuration such that the density of the nitrogen atoms contained in the silicon oxynitride film 102 decreases as the distance from the interface of the semiconductor substrate 100 increases in the film-thickness direction of the silicon oxynitride film 102, the oxygen-deficient film being present at the interface of the semiconductor substrate 100 can be substituted with the silicon oxynitride film 102 so that the defect density is reduced, and increase in the defect density that is caused when the silicon oxide film 103 is substituted with the silicon oxynitride film 102 can be suppressed.

The non-volatile memory cell according to the present embodiment is configured in the above described manner, and the operations thereof will be described below. As basic operations of the present non-volatile memory cell, three operations, that is, (1) write, (2) erase, and (3) read will be described. Note that, in the present specification, an operation of increasing charges in the charge storage film is assumed to be a write operation, and the operation of reducing charges is assumed to be an erase operation.

(1) In the write operation, with reference to FIG. 1, an electric potential difference is applied between the source region and the drain region. In this state, a high gate overdrive voltage is applied to the gate electrode 108, thereby forming a channel region in the vicinity of the surface of the p-type well 101 below the gate electrode 108. Under this voltage condition, a strong electric field is generated in the channel region below the gate electrode 108, and a lot of hot electrons are generated. Part of the generated hot electrons is injected into the silicon nitride film 104, which is the charge storage film, via the tunnel silicon oxide film 107, thereby carrying out write.

(2) In the erase operation, a negative electric potential is applied to the gate electrode 108, and a positive electric potential is applied to the source region. As a result, strong inversion is generated in the region of an end portion of the source region where the gate electrode 108 is overlapped with the source region; consequently, an interband tunnel phenomenon is caused, and holes can be generated. In the non-volatile memory cell, the generated holes are attracted by the bias voltage (negative voltage) applied to the gate electrode 108 to be injected into the silicon nitride film 104, which is the charge storage film; thus, the erase operation is carried out. That is, erase is carried out by lowering the threshold value of the gate electrode 108, which has been increased by injecting the hot electrons, by injecting the holes.

(3) In the read operation, an appropriate gate electric potential at a level capable of determining the threshold value difference of the gate electrode 108 which is provided by the written state/erased state is applied. As a result, in the written state, a channel is formed in the surface of the p-type well 101 below the gate electrode 108, and a current flows therethrough. On the other hand, in the erased state, no channel is formed in the surface of the p-type well 101 below the gate electrode 108 so that almost no current flows therethrough. Therefore, the written state and the erased state of the non-volatile memory cell can be determined by the amount of the current that flows through the channel.

Alternatively, the read operation can be carried out in the following manner. For example, in the non-volatile memory cell of the present embodiment, a voltage is applied to the gate electrode 108 to form a channel in the vicinity of the surface of the semiconductor substrate 100, and a current Id that flows between the source region and the drain region is measured. This current Id is dependent on a voltage Vg applied to the gate electrode 108. Whether the non-volatile memory cell is in the written state or the erased state can be specified by the value of the voltage Vg that provides a predetermined current Id. In other words, when the voltage Vg applied to the gate electrode 108 in order to cause the predetermined current Id to flow increases (when the threshold value increases), it is determined to be in the written state. On the other hand, when the voltage Vg applied to the gate electrode 108 in order to cause a predetermined current Id to flow decreases (when the threshold value decreases), it is determined to be in the erased state. The read operation can be also carried out in this manner.

Herein, the write operation is carried out by increasing the threshold value by trapping charges (carriers) in a trap level being present in the silicon nitride film 104, which is the charge storage film. In other words, the operation is carried out by increasing the voltage Vg applied to the gate electrode 108 for providing a predetermined current Id. At this point, if the charges accumulated in the silicon nitride film 104 is leaked even when it is in the written state, the voltage Vg applied to the gate electrode 108 for providing the predetermined current Id decreases. This means that the information written to the non-volatile memory cell is lost. Thus, the non-volatile memory cell, which is supposed to be in the written state, is erroneously determined to be in the erased state.

A conceivable cause of that is defects which are formed in the tunnel silicon oxide film 107 when the non-volatile memory cell is repeatedly driven (write operations and/or erase operations). There is the mechanism that the charges trapped in the trap level in the silicon nitride film 104 are discharged to the semiconductor substrate 100 by the tunneling phenomenon via the formed defects. Particularly, when the tunnel silicon oxide film 107 is composed only of the silicon oxide film 103, the problem readily occurs that the charges are discharged from the silicon nitride film 104 as the oxygen-deficient film is formed between the silicon oxide film 103 and the semiconductor substrate 100, since a lot of defects are formed in the oxygen-deficient film.

Therefore, in the present embodiment, as illustrated in FIG. 1, the tunnel silicon oxide film 107 is composed of the stacked film of the silicon oxynitride film 102 and the silicon oxide film 103. More specifically, the silicon oxynitride film 102 is formed to be in contact with the interface of the semiconductor substrate 100, and the silicon oxide film 103 is formed on the silicon oxynitride film 102. As a result, the oxygen-deficient film formed at the interface of the semiconductor substrate 100 can be substituted with the silicon oxynitride film 102.

The silicon oxynitride film 102 has a feature that the defect density thereof is lower than that of the oxygen-deficient film. Therefore, as compared with the structure in which the oxygen-deficient film is formed at the interface of the semiconductor substrate 100, when the structure in which the silicon oxynitride film 102 is formed at the interface of the semiconductor substrate 100 is employed, the density of the defects formed in the tunnel silicon oxide film 107 can be reduced, and thus the charge retention characteristics of the non-volatile memory cell can be improved. Therefore, the non-volatile memory cell which is supposed to be in the written state can be prevented from being erroneously determined to be in the erased state.

Next, a manufacturing method of the non-volatile memory cell according to the present embodiment will be described with reference to the drawings. In the drawings, a non-volatile memory cell formation region is illustrated.

Figure 2:
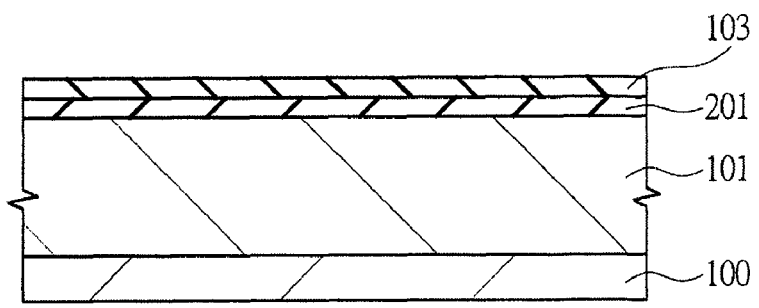
FIG. 2 is a cross-sectional view illustrating a step of manufacturing the non-volatile memory cell of the embodiment.

First, as illustrated in FIG. 2, a semiconductor substrate 100 formed of silicon single crystal into which a p-type impurity such as boron (B) is introduced is prepared. At this point, the semiconductor substrate 100 is in the state of a semiconductor wafer having a substantially disk-like shape. Then, device isolation regions (not shown) which isolate the non-volatile memory cell formation region and the formation regions of other peripheral circuits of the semiconductor substrate 100 are formed. The device isolation regions are provided to prevent mutual interference of the devices. The device isolation regions can be formed, for example, by using a LOCOS (local Oxidation of silicon) method or an STI (Shallow trench isolation) method. For example, in the STI method, the device isolation regions are formed in the following manner. Specifically, device isolation trenches are formed on the semiconductor substrate 100 by using the photolithography technique and etching technique. Then, a silicon oxide film is formed on the semiconductor substrate 100 so as to fill the device isolation trenches; and then, an unnecessary part of silicon oxide film that is formed on the semiconductor substrate 100 is removed by the chemical mechanical polishing (CMP). As a result, the device isolation regions in which the silicon oxide film is embedded only in the device isolation trenches can be formed.

Next, the p-type well 101 is formed by introducing an impurity into the active region (non-volatile memory cell formation region), which is isolated by the device isolation regions. The p-type well 101 can be formed by introducing a p-type impurity such as boron into the semiconductor substrate 100 by ion implantation. Subsequently, a semiconductor region (not shown) for channel formation is formed in a surface region of the p-type well 101. The semiconductor region for channel formation is formed to adjust the threshold voltage for forming a channel.

Subsequently, the silicon oxide film 103 is formed on the semiconductor substrate 100 that is a single crystal and exposes the (100) plane on the surface. The film thickness of the silicon oxide film 103 is, for example, 4 nm. Herein, a hydrogen/oxygen method (method of retaining in a mixed atmosphere of hydrogen and oxygen at 1000° C. and for 50 seconds) can be used as the method of forming the silicon oxide film 103. Furthermore, as the method of forming the silicon oxide film 103, a water vapor method (method of retaining in a water-vapor atmosphere at 900° C. and for 60 seconds) or a dry method (method of retaining in an oxygen atmosphere at 950° C. and for 120 seconds) can be also used.

Meanwhile, even when the process temperature in the hydrogen/oxygen method is changed to 1050° C. or 950° C., the film thickness can be readily adjusted by respectively adjusting the process time. However, for example, when the process is carried out at a higher temperature such as 1200° C., the damage caused by heat is accumulated in the silicon oxide film 103, and a good film cannot be formed. That is, when the silicon oxide film 103 is treated at a temperature higher than or equal to 1200° C., the silicon oxide film 103 is deteriorated, and pinholes, cracks, and the like are readily generated. In addition, the surface of the silicon oxide film 103 becomes rough. Furthermore, the silicon oxide film 103 is formed to have a film thickness thicker than a predetermined value (for example, 4 nm). On the other hand, when the silicon oxide film 103 is processed at a low temperature of 800° C. or less, the growth rate of the silicon oxide film 103 is lowered, and the required time for forming, for example, a film thickness of merely 4 nm is notably increased; therefore, this is not suitable for the film formation condition of the silicon oxide film 103. Therefore, temperature of about 1000° C.±50° C. is practical and suitable for the present embodiment. In this process, between the silicon oxide film 103 and the semiconductor substrate 100 (p-type well 101), an oxygen-deficient film 201, which is a silicon oxide film in the state that oxygen is stoichiometrically deficient, is inevitably formed. The oxygen-deficient film 201 is a film generated due to, for example, the differences in the lattice constants of the silicon of the semiconductor substrate 100 and the silicon oxide film 103 (stress relaxation) and is formed regardless of the manufacturing method of the silicon oxide film 103.

Figure 3:
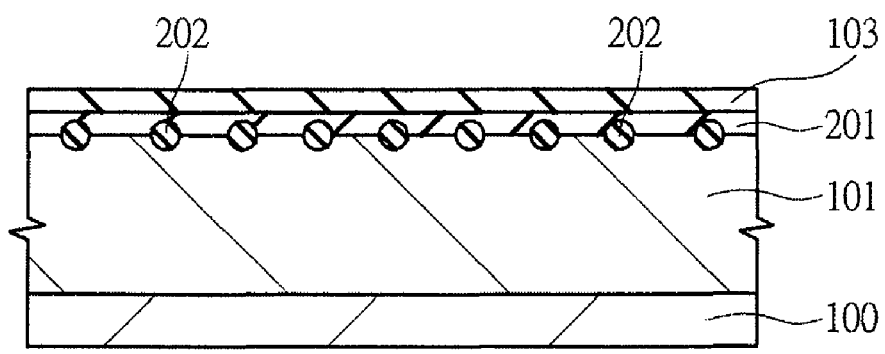
FIG. 3 is a cross-sectional view illustrating the step of manufacturing the non-volatile memory cell continued from FIG. 2.

Next, as illustrated in FIG. 3, nitrogen atoms 202 are introduced into the interface of the semiconductor substrate 100 (p-type well 101) by a thermal treatment of retaining at 1050° C. in a nitrogen monoxide gas atmosphere and for 60 seconds. More specifically, the nitrogen atoms 202 are introduced between the p-type well 101 and the oxygen-deficient film 201. In this process, if the introducing amount of the nitrogen atoms 202 is too large, positive fixed charges due to the nitrogen atoms 202 are generated; therefore, control of the operating voltage of the non-volatile memory cell becomes difficult. On the other hand, if the introducing amount of the nitrogen atoms 202 is too small, the effect of thermal re-oxidation, which will be described later, cannot be sufficiently obtained. Therefore, the introducing amount of the nitrogen atoms 202 (density of the nitrogen atoms 202) is desirably within the range of 3% to 7% with respect to the density of the silicon atoms disposed on the first surface layer of the semiconductor substrate 100 (p-type well 101).

The amount (density) of the nitrogen atoms 202 introduced herein can be checked to be within the range of 3% to 7% with respect to the density of the atoms of silicon disposed on the first surface layer of the semiconductor substrate 100 (p-type well 101) by quantification of the amount of the nitrogen atoms by SIMS (Secondary Ion Mass Spectroscopy), X-ray photoelectron spectroscopy or by quantification by TEM-EELS (Transmitted Electron Microscope-Electron Energy Loss Spectroscopy) measurement.

Note that the process temperature here is 1050° C.; however, when the process temperature is too low, the nitrogen atoms 202 are not introduced into the interface of the semiconductor substrate 100; and, reversely, when the process temperature is too high, the silicon oxide film 103 itself is damaged by heat. Therefore, the process temperature is preferably within the range of 900° C. to 1100° C. Moreover, the process time here is 60 seconds; however, the process time is a value that can be changed depending on the process temperature, and the process time can be adjusted, for example, in the range of 300 seconds to 30 seconds when the process temperature is in the range of 900° C. to 1100° C.

In the present embodiment, in the step of introducing the nitrogen atoms 202 into the interface of the semiconductor substrate 100 (p-type well 101), nitrogen monoxide is used as the atmosphere, and the reason thereof will be explained. The nitrogen atoms constituting nitrogen monoxide are radicalized during the heat treatment, thereby increasing the speed of diffusion in the silicon oxide film 103 and obtaining a high reactivity. The surface of the semiconductor substrate 100 has many defects (for example, dangling bonds) and is also in a highly reactive state. Therefore, the radicalized nitrogen atoms are quickly reacted with the defects formed on the surface of the semiconductor substrate 100, and, as a result, the nitrogen atoms are localized on the surface of the semiconductor substrate 100.

On the other hand, in the case of a gas species such as ammonia in which nitrogen atoms are ionized instead of being radicalized, substitution reactions with oxygen atoms preferentially occur on the surface of the silicon oxide film 103; and, as a result, the nitrogen atoms are taken in from the surface (upper surface) of the silicon oxide film 103. Thus, in the case of the gas species such as ammonia in which nitrogen atoms are ionized instead of being radicalized, the nitrogen atoms cannot be localized mainly at the interface of the semiconductor substrate 100; therefore, this cannot be used in the present embodiment.

A plasma nitriding method utilizing nitrogen atoms in a plasma state can be referred to as another method. However, in the plasma nitriding method, both ionized nitrogen atoms and radicalized nitrogen atoms are generated at the same time; therefore, it is also difficult to generate the state in which the nitrogen atoms are localized at the interface of the semiconductor substrate 100.

In this manner, in the present embodiment, the nitrogen atoms have to be localized at the interface of the semiconductor substrate 100 while suppressing nitridation of the surface of the silicon oxide film 103. The reason for generating this state is that the oxygen-deficient film 201 has to be substituted with the silicon oxynitride film by sufficiently carrying out formation of the silicon oxynitride film, which is carried out in a step thereafter, on the interface of the semiconductor substrate, and, at the same time, substituting the silicon oxide film 103 with the silicon oxynitride film has to be avoided as much as possible. More specifically, when the nitrogen atoms are localized at the interface of the semiconductor substrate 100, the oxygen-deficient film being present at the interface of the semiconductor substrate 100 can be efficiently substituted with the silicon oxynitride film. In order to realize this state, in the thermal treatment of introducing nitrogen atoms, an atmosphere capable of forming radicalized nitrogen atoms is preferably used. Typical examples that satisfy this condition include the nitrogen monoxide atmosphere. However, as long as the atmosphere is capable of mainly forming radicalized nitrogen atoms, it is not limited to nitrogen monoxide, and, for example, an atmosphere of nitrogen dioxide, dinitrogen monoxide, or the like may be used. In other words, the nitrogen atoms are mainly radicalized also in the thermal treatment using these atmospheres.

Note that, in the step of introducing the nitrogen atoms 202 into the interface of the semiconductor substrate 100 (p-type well 101), for example, the concentration of the nitrogen monoxide gas is 100%, the flow rate of the nitrogen monoxide gas is 1.0 L/min, and the pressure of the nitrogen monoxide gas is $9.9 \times 10^4$ Pa.

Figure 4:
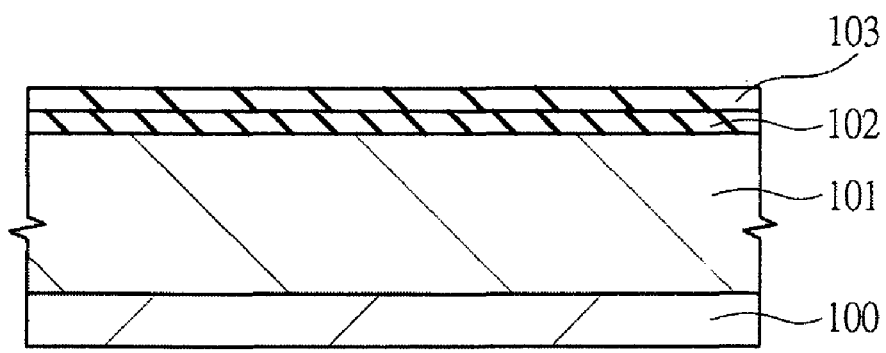
FIG. 4 is a cross-sectional view illustrating the step of manufacturing the non-volatile memory cell continued from FIG. 3.

Next, as illustrated in FIG. 4, the thermal re-oxidation is carried out, thereby diffusing the nitrogen atoms 202 in the film-thickness direction of the silicon oxide film 103 and causing them to undergo reaction. In this process, as illustrated in FIG. 4, the nitrogen atoms 202 are reacted with the oxygen-deficient film 201, which is present at the interface of the silicon oxide film 103 and the semiconductor substrate 100 (p-type well 101), so that the silicon oxynitride film 102, which is chemically stable, is formed.

Herein, as illustrated in FIG. 3, the nitrogen atoms 202 are diffused from the state in which they are localized at the interface of the semiconductor substrate 100; therefore, it is configured such that the density of the nitrogen atoms contained in the silicon oxynitride film 102 decreases as the distance from the interface of the semiconductor substrate 100 increases in the film-thickness direction of the silicon oxynitride film 102. As a result, the oxygen-deficient film 201 being present at the interface of the semiconductor substrate 100 can be sufficiently substituted with the silicon oxynitride film 102, and, at the same time, substituting the silicon oxide film 103 being present above the oxygen-deficient film 201 with the silicon oxynitride film 102 can be suppressed.

The conditions of the thermal re-oxidation are the conditions of heating the semiconductor substrate 100 at 1000° C. and for 60 seconds. The atmosphere of the thermal re-oxidation is 100% oxygen. If the process temperature of the thermal re-oxidation is equal to or higher than 1100° C., the silicon oxide film 103 is damaged by heat, and defects are generated in the silicon oxide film 103. Furthermore, growth of the silicon oxide film 103 also occurs at the same time; therefore, the film thickness of the silicon oxide film 103 is increased. In this case, these are the factors that make the control of the non-volatile memory cell difficult; therefore, the process temperature of the thermal re-oxidation has to be 1100° C. or less. On the other hand, if the process temperature of the thermal re-oxidation is too low, the reaction between the nitrogen atoms 202 and the oxygen-deficient film 201 is not sufficiently promoted; therefore, the effect of converting the oxygen-deficient film 201 into the silicon oxynitride film 102 cannot be sufficiently obtained. Therefore, the process temperature of the thermal re-oxidation is preferably 900° C. to 1100° C.

If the retention time of the thermal re-oxidation is too long, the nitrogen atoms 202 are diffused over the oxygen-deficient film 201 and reach the silicon oxide film 103, which is present above the oxygen-deficient film 201. Then, not only the oxygen-deficient film 201, but also the silicon oxide film 103 is nitrided; therefore, the charge retention characteristics of the non-volatile memory cell are adversely deteriorated. Thus, the retention time of the thermal re-oxidation is set to 60 seconds in order to suppress nitridation of the silicon oxide film 103. However, the value, that is, 60 seconds, which is the retention time of the thermal re-oxidation is a value that can be changed depending on the process temperature and can be adjusted within the range of 300 seconds to 30 seconds with respect to the process temperature of 900° C. to 1100° C.

In this manner, in the present embodiment, the step of introducing the nitrogen atoms 202 into the interface of the semiconductor substrate 100 (p-type well 101) is carried out, and then the above-described thermal re-oxidation is carried out; as a result, without nitriding the silicon oxide film 103, the oxygen-deficient film 201 can be sufficiently nitrided so that the silicon oxynitride film 102 is formed.

In the thermal re-oxidation, the gas atmosphere thereof is 100% oxygen; however, an inert gas such as argon may be contained. However, if active ammonia, moisture, or the like is contained, nitridation of the silicon oxide film 103 or increase in the film thickness of the silicon oxide film 103 due to the moisture is caused. Therefore, active gases have to be removed in the thermal re-oxidation. Note that, if the oxygen content in the atmosphere is too low, the phenomenon occurs that formation of the silicon oxynitride film 102 is not sufficiently carried out. Therefore, the oxygen concentration in the atmosphere of the thermal re-oxidation is preferably 50% to 100%. The effects similar to those of the present embodiment can be obtained also by using ozone instead of oxygen in the atmosphere. However, when a compound gas containing, in addition to oxygen atoms, atoms other than oxygen such as carbon monoxide, is used, atoms of a different kind of species such as carbon are injected into the film. Then, various problems such as accumulation of positive charges, reduction of withstand voltage, generation of new defect levels, and the like are caused; therefore, it is difficult to obtain the effects equivalent to those of the present embodiment.

Figure 5:
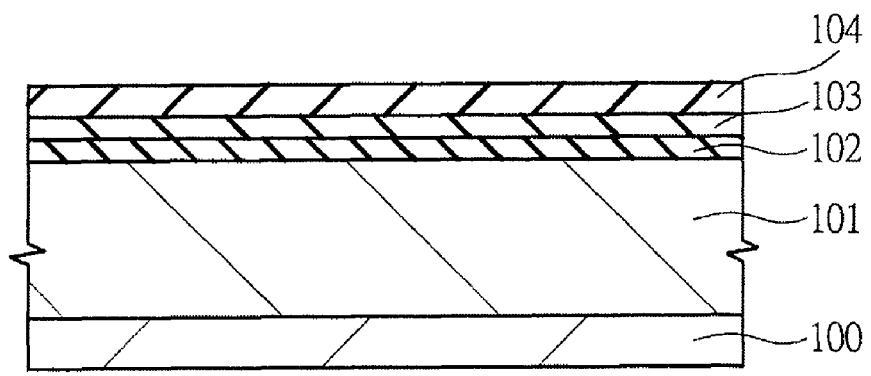
FIG. 5 is a cross-sectional view illustrating the step of manufacturing the non-volatile memory cell continued from FIG. 4.

Next, as illustrated in FIG. 5, the silicon nitride film 104 is formed on the silicon oxide film 103. The silicon nitride film 104 can be formed by a chemical vapor deposition method (CVD) in which the semiconductor substrate 100 is retained at 650° C. for 60 seconds in a mixed atmosphere of ammonia and dichlorosilane. Note that the silicon nitride film 104 can be also formed by using the CVD method using another source gas. The film thickness of the silicon nitride film 104 is 3 nm to 6 nm.

In the above described CVD method, ammonia is used as a source gas. Therefore, nitridation of the silicon oxide film 103, which is the film in a lower layer, by nitrogen ions generated from ammonia is worried about. However, in the CVD method, the process temperature is 650° C. which is a low temperature; therefore, it is not problematic as the effect of nitriding the upper part of the silicon oxide film 103 is small enough to be ignorable.

Figure 6:
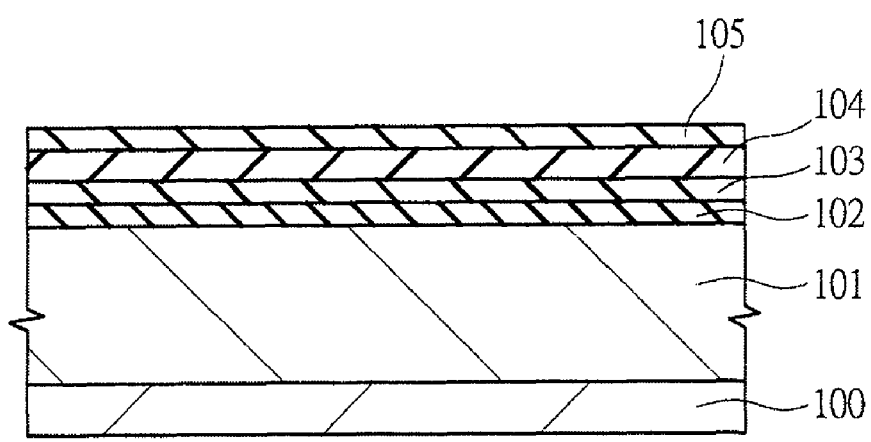
FIG. 6 is a cross-sectional view illustrating the step of manufacturing the non-volatile memory cell continued from FIG. 5.

Subsequently, as illustrated in FIG. 6, the silicon oxide film 105 is formed on the silicon nitride film 104. The film thickness of the silicon oxide film 105 is 3 nm to 5 nm. The formation methods of the silicon oxide film 105 include a method of holding the semiconductor substrate 100 at 950° C.

in a water-vapor atmosphere for 60 seconds; however, it may be formed by another method.

Figure 7:
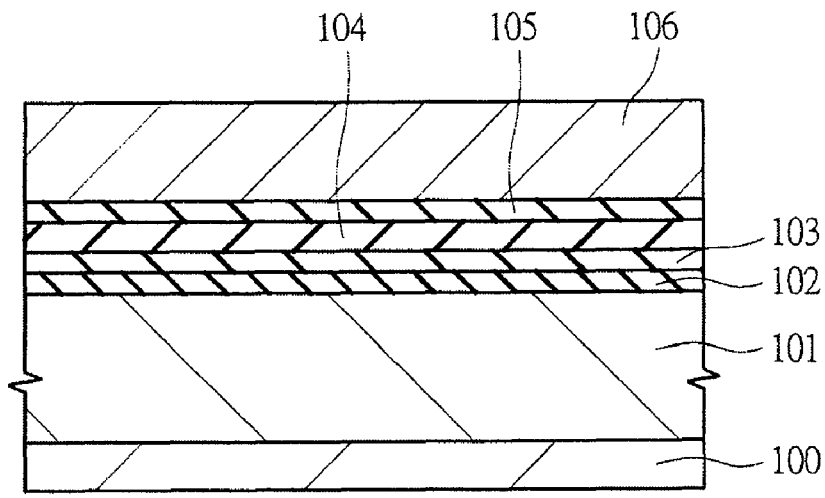
FIG. 7 is a cross-sectional view illustrating the step of manufacturing the non-volatile memory cell continued from FIG. 6.

Next, as illustrated in FIG. 7, the polysilicon film 106 is formed on the silicon oxide film 105. The polysilicon film 106 can be formed, for example, by a CVD method in which monosilane is used as a source gas, and the process temperature thereof is 600° C.

Figure 8:
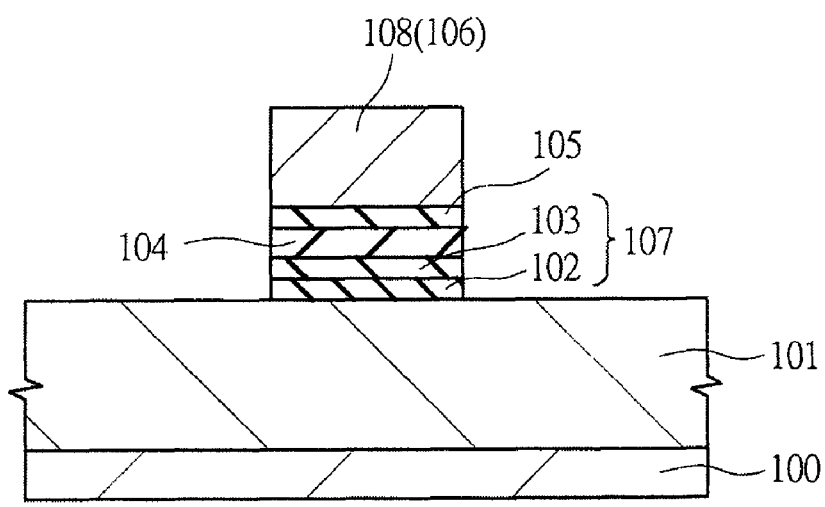
FIG. 8 is a cross-sectional view illustrating the step of manufacturing the non-volatile memory cell continued from FIG. 7.

Then, as illustrated in FIG. 8, by using the photolithography technique and etching technique, the polysilicon film 106, the silicon oxide film 105, the silicon nitride film 104, the silicon oxide film 103, and the silicon oxynitride film 102 are subjected to patterning. As a result, the tunnel silicon oxide film 107 formed of the silicon oxynitride film 102 and the silicon oxide film 103, the silicon nitride film 104 which is the charge storage film formed on the tunnel silicon oxide film 107, the silicon oxide film 105 formed on the silicon nitride film 104, and the gate electrode 108 formed of the polysilicon film 106 formed on the silicon oxide film 105 can be formed.

Figure 9:
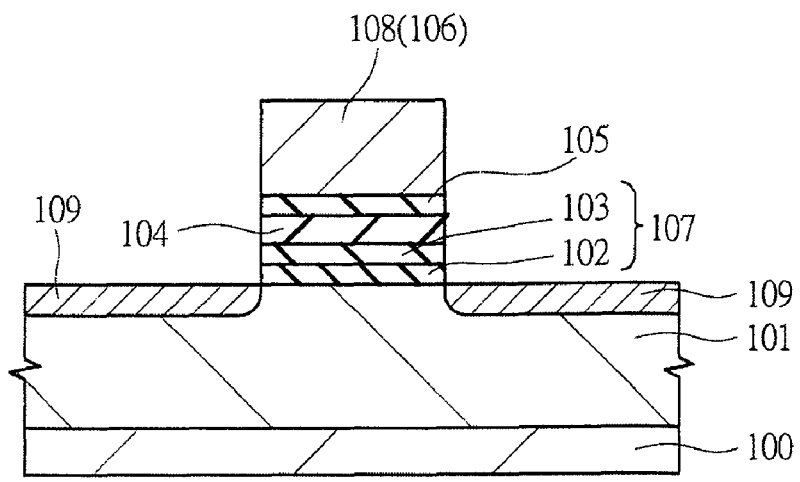
FIG. 9 is a cross-sectional view illustrating the step of manufacturing the non-volatile memory cell continued from FIG. 8.

Subsequently, as illustrated in FIG. 9, by using the photolithography technique and ion implantation, the shallow low-concentration n-type impurity diffusion regions 109 aligned with the gate electrode 108 are formed. The shallow low-concentration n-type impurity diffusion regions 109 are semiconductor regions.

Figure 10:
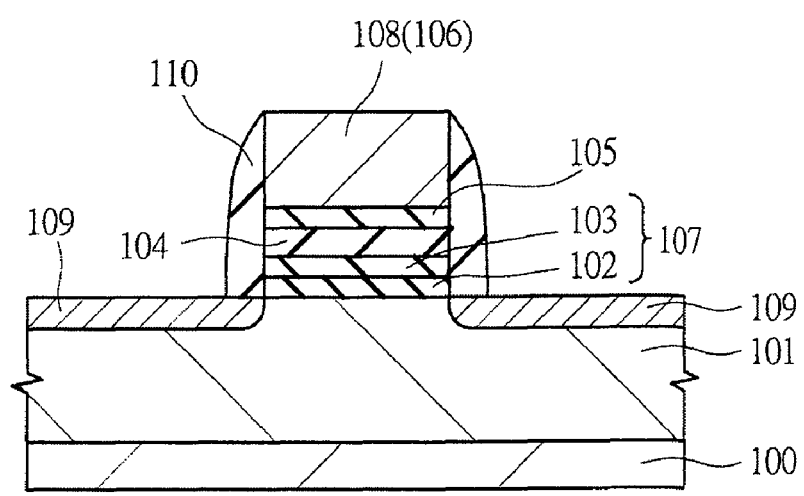
FIG. 10 is a cross-sectional view illustrating the step of manufacturing the non-volatile memory cell continued from FIG. 9.

Next, a silicon oxide film is formed on the semiconductor substrate 100. The silicon oxide film can be formed, for example, by using the CVD method. Then, as illustrated in FIG. 10, the silicon oxide film is subjected to anisotropic etching, thereby forming the sidewall spacers 110 on the sidewalls of the gate electrode 108. The sidewall spacers 110 are formed of a single-layer film of a silicon oxide film; however, it is not limited to this. For example, sidewall spacers formed of a stacked film of a silicon nitride film and a silicon oxide film may be formed.

Figure 11:
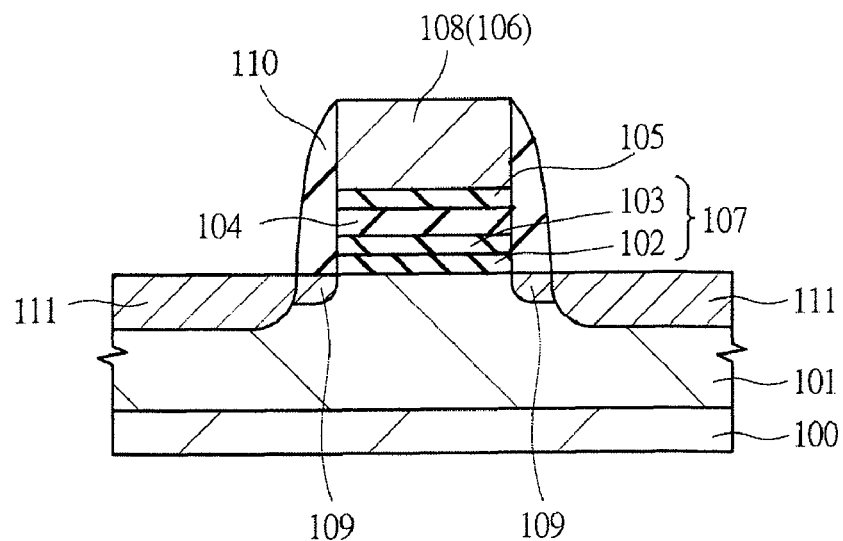
FIG. 11 is a cross-sectional view illustrating the step of manufacturing the non-volatile memory cell continued from FIG. 10.

Subsequently, as illustrated in FIG. 11, by using the photolithography technique and ion implantation, the deep high-concentration n-type impurity diffusion regions 111 aligned with the sidewalls 110 are formed. The deep high-concentration n-type impurity diffusion regions 111 are semiconductor regions. The source region is formed by the deep high-concentration n-type impurity diffusion region 111 and the shallow low-concentration n-type impurity diffusion region 109. Similarly, the drain region is formed by the deep high-concentration n-type impurity diffusion region 111 and the shallow low-concentration n-type impurity diffusion region 109. When the source region and the drain region are formed by the shallow low-concentration n-type impurity diffusion regions 109 and the deep high-concentration n-type impurity diffusion regions 111, the source region and the drain region can have the LDD (Lightly Doped Drain) structure.

After the deep high-concentration n-type impurity diffusion regions 111 are formed in this manner, a thermal treatment at about 1000° C. is carried out. As a result, the introduced impurity is activated.

Then, a cobalt film is formed on the semiconductor substrate 100. Herein, the cobalt film is formed to be in direct contact with the gate electrode 108. Similarly, the cobalt film is also in direct contact with the deep high-concentration n-type impurity diffusion regions 111.

Figure 12:
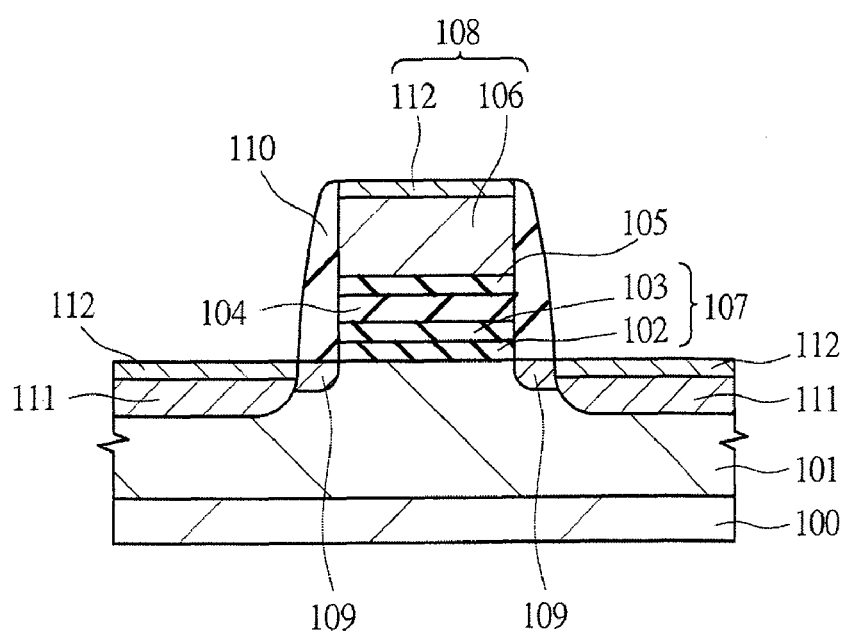
FIG. 12 is a cross-sectional view illustrating the step of manufacturing the non-volatile memory cell continued from FIG. 11.

The cobalt film can be formed, for example, by using a sputtering method. Then, as illustrated in FIG. 12, after the cobalt film is formed, a thermal treatment is carried out, thereby reacting the polysilicon film 106, which constitutes a part of the gate electrode 108, with the cobalt film to form the cobalt silicide film 112. The cobalt silicide film 112 is formed for reducing the resistance of the gate electrode 108. Similarly, silicon is reacted with the cobalt film by the above-described thermal treatment on the surfaces of the deep high-concentration n-type impurity diffusion regions 111, so that the cobalt silicide film 112 is formed. Therefore, reduction of resistance can be achieved also in the deep high-concentration n-type impurity diffusion regions 111.

Then, the cobalt silicide film that has not been reacted is removed from the semiconductor substrate 100. Note that the present embodiment is configured to form the cobalt silicide film 112; however, for example, a nickel silicide film or a titanium silicide film may be formed instead of the cobalt silicide film 112. In the above-described manner, the non-volatile memory cell can be formed on the semiconductor substrate 100.

Next, a wiring step will be described. As illustrated in FIG. 1, the silicon oxide film 113 serving as an interlayer insulating film is formed on the main surface of the semiconductor substrate 100. The silicon oxide film 113 can be formed, for example, by using the CVD method using TEOS (tetraethyl orthosilicate) as a source material. Then, the surface of the silicon oxide film 113 is planarized, for example, by using the CMP (Chemical Mechanical Polishing).

Subsequently, by using the photolithography technique and the etching technique, the contact holes 114 are formed in the silicon oxide film 113. Then, the titanium/titanium nitride film 115a is formed on the silicon oxide film 113 including the bottom surfaces and the inner walls of the contact holes 114. The titanium/titanium nitride film 115a is formed of a stacked film of a titanium film and a titanium nitride film and can be formed, for example, by using the sputtering. The titanium/titanium nitride film 115a has a so-called barrier property that prevents, for example, tungsten, which is a material of the film to be embedded in a later step, from being diffused into silicon.

Subsequently, the tungsten film 115b is formed on the entire surface of the main surface of the semiconductor substrate 100 so as to fill the contact holes 114. The tungsten film 115b can be formed, for example, by using the CVD method. Then, the plugs 116 can be formed by removing the unnecessary titanium/titanium nitride film 115a and tungsten film 115b, which are formed on the silicon oxide film 113, for example, by the CMP method.

Next, the titanium/titanium nitride film 117a, the aluminum film 117b containing copper, and the titanium/titanium nitride film 117c are sequentially formed on the silicon oxide film 113 and the plugs 116. These films can be formed, for example, by using the sputtering method. Subsequently, by using the photolithography technique and the etching technique, these films are subjected to patterning, thereby forming the wiring 118. Furthermore, wiring is formed in a layer above the wiring 118; however, the explanation thereof is omitted here. In this manner, the non-volatile semiconductor memory device according to the present embodiment can be formed.

Next, results of verifying superiority in the characteristics of the non-volatile memory of the present embodiment by physical analytical methods will be described.

Figures 13, 14:
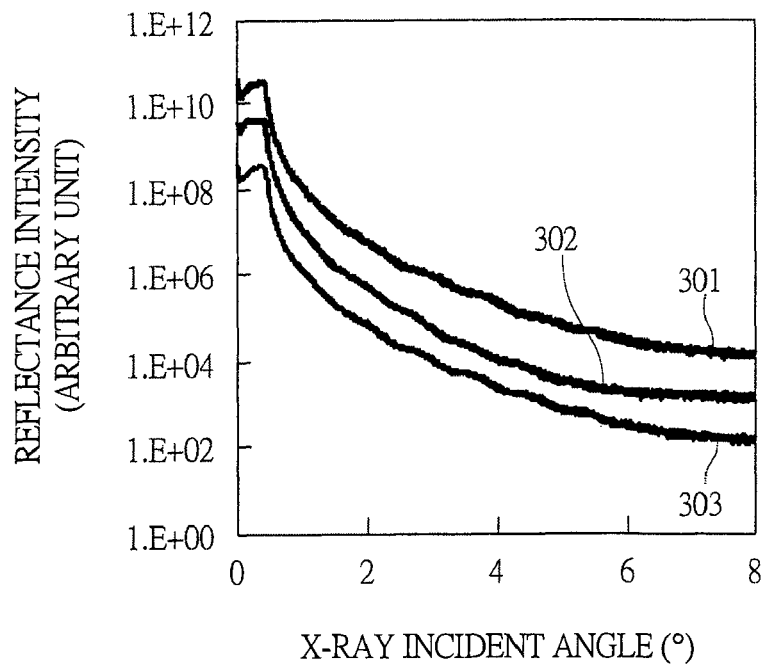
FIG. 13 is a graph illustrating results of a measurement carried out by the X-ray reflectivity to measure a film thickness of an oxygen-deficient film formed between a semiconductor substrate and a silicon oxide film when the silicon oxide film is formed on the semiconductor substrate.
FIG. 14 is a table illustrating film thicknesses of the oxygen-deficient films calculated as a result of the measurement by the X-ray reflectivity.

FIG. 13 illustrates the results of evaluation of the film thicknesses of oxygen-deficient films carried out by using an X-ray reflectivity. The X-ray reflectivity is a method of measuring the film thickness of a film by irradiating the film with X-rays and measuring the reflected rays thereof. In FIG. 13, the horizontal axis is an X-ray incident angle, and the vertical axis is a reflectance intensity of X-rays. A curve 301 of FIG. 13 is the curve showing a relation between the incident angle of X-rays and the reflectance intensity of X-rays of a sample in which a silicon oxide film is formed on a semiconductor substrate by the hydrogen/oxygen method. Similarly, a curve 302 is the curve showing a relation between the incident angle of X-rays and the reflectance intensity of X-rays of a sample in which a silicon oxide film is formed on a semiconductor substrate by the water vapor method. Furthermore, a curve 303 is the curve showing a relation between the incident angle of X-rays and the reflectance intensity of X-rays of a sample in which a silicon oxide film is formed on a semiconductor substrate by the dry method. Herein, typical conditions were used as the conditions for forming the silicon oxide films. Specifically, a heating treatment was carried out at 1000° C. and for 50 seconds in the hydrogen/oxygen method, a heating treatment was carried out at 900° C. and for 60 seconds in the water vapor method, and a heating treatment was carried out at 950° C. and for 120 seconds in the dry method. Therefore, it can be understood that the preparation conditions of the samples are equivalent conditions as the manufacturing conditions of the non-volatile memory cell.

The film thicknesses of the oxygen-deficient films can be evaluated by comparing the oscillatory waveforms illustrated by the curves 301 to 303 with the results of theoretical calculations. FIG. 14 illustrates results of analysis of the film thicknesses of the oxygen-deficient films. More specifically, as illustrated in FIG. 14, the film thickness of the oxygen-deficient film is 0.8 nm in the curve 301 (hydrogen/oxygen method), and the film thickness of the oxygen-deficient film is 2.0 nm in the curve 302 (water vapor method). Furthermore, it can be understood that the film thickness of the oxygen-deficient film is 1.2 nm in the curve 303 (dry method). According to these results, it can be understood that, when a silicon oxide film is formed on a semiconductor substrate, an oxygen-deficient film is formed at the interface of the semiconductor substrate regardless of the manufacturing method such as the hydrogen/oxygen method, the water vapor method, or the dry method. In addition, it can be understood that the film thickness of the oxygen-deficient film is less than or equal to 2 nm.

Subsequently, in order to verify that defects are formed in the oxygen-deficient film when the non-volatile memory cell is repeatedly driven (write operations and erase operations), hereinafter, experiments of checking the correlation between the film thicknesses of the oxygen-deficient films and the density of the defects formed in the oxygen-deficient films by electrical stress were carried out.

Figure 15:
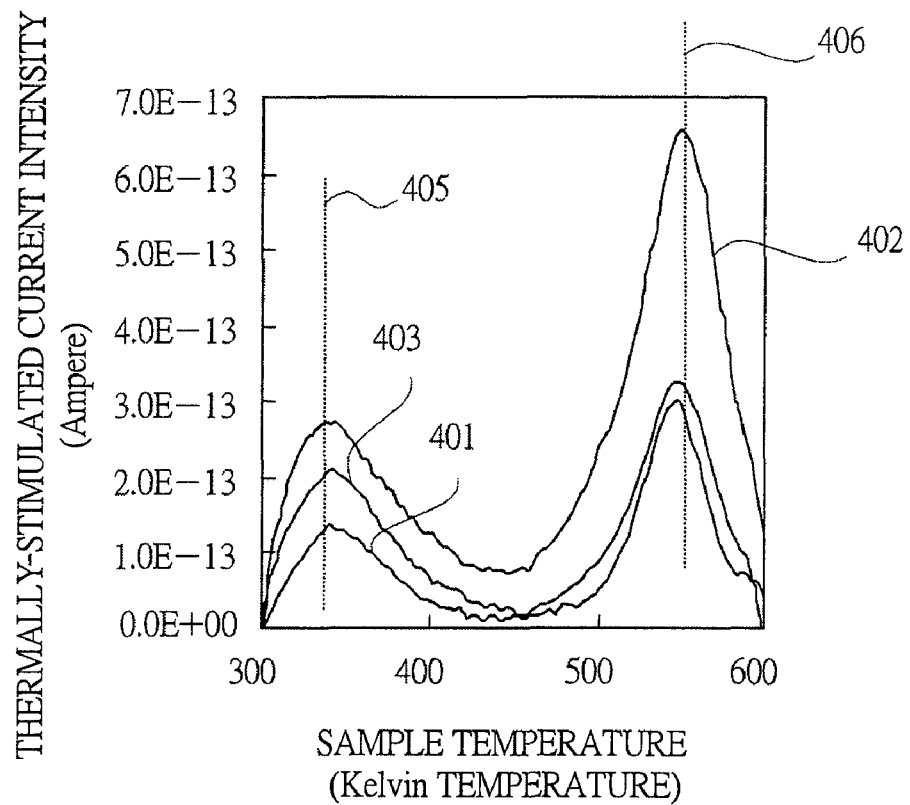
FIG. 15 is a graph illustrating results of subjecting samples having a structure of semiconductor substrate/oxygen-deficient film/silicon oxide film to a thermally-stimulated current measurement.

FIG. 15 is a graph illustrating a relation between sample temperatures and thermally-stimulated current intensities. In FIG. 15, the horizontal axis is a sample temperature, and the vertical axis is a thermally-stimulated current intensity. Curves 401, 402, and 403 of FIG. 15 are results of carrying out the thermally-stimulated current measurement. The samples used in this measurement are the same as the samples used for measuring the film thicknesses of the oxygen-deficient films by the X-ray reflectivity. Therefore, as to the curves 401, 402, and 403, measurements were carried out with respect to the samples in which the silicon oxide films were formed on the semiconductor substrates by the hydrogen/oxygen method, the water vapor method, and the dry method, respectively.

Figure 16:
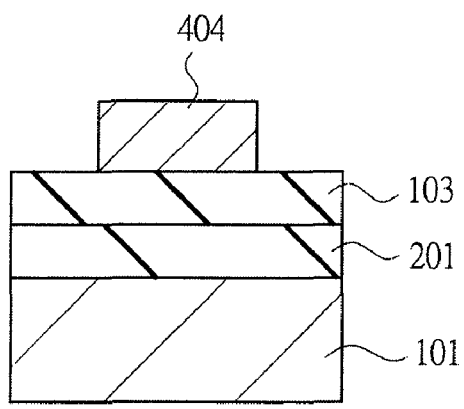
FIG. 16 is a cross-sectional view illustrating the structure of the samples for measuring thermally-stimulated currents.

A cross-sectional view of the samples used in the thermally-stimulated current measurement is illustrated in FIG. 16. As illustrated in FIG. 16, in the sample used in the thermally-stimulated current measurement, the silicon oxide film 103 is formed on the semiconductor substrate 100, and an aluminum electrode 404 is formed above the silicon oxide film 103. At this point, the oxygen-deficient film 201 is formed between the semiconductor substrate 100 and the silicon oxide film 103.

In the thermally-stimulated current measurement, with respect to the sample, a voltage is applied across the aluminum electrode 404 and the semiconductor substrate 100 in the state of the room temperature, thereby injecting a current between the aluminum electrode 404 and the semiconductor substrate 100. As a result, current stress can be applied to the oxygen-deficient film 201. More specifically, the current that flows between the aluminum electrode 404 and the semiconductor substrate 100 serves as the current stress with respect to the oxygen-deficient film 201. Herein, the total charge amount caused to flow through the oxygen-deficient film 201 is set to the amount corresponding to performing 5000 times of rewrites. More specifically, in the non-volatile memory cell, in a write operation or a read operation, charges pass through the oxygen-deficient film, which constitutes a part of the tunnel silicon oxide film. Therefore, when rewrite is repeated, the total charge amount that passes through the oxygen-deficient film increases. In order to realize verification of the reproduced phenomenon thereof, in the present embodiment, for example, the total electric charge amount corresponding to 5000 times of rewrites serves as the electric stress.

After the current was injected into the oxygen-deficient film 201 in the above-described manner, the sample temperature was increased at a pace of 20° C. per a minute, and the value of the current that flows between the aluminum electrode 404 and the semiconductor substrate 100 during that period was measured; and the results thereof are shown in FIG. 15. This measurement measures the electric charge amount discharged from the defects formed in the film as a result of injecting the current corresponding to 5000 times of rewrites. The sample temperatures of the horizontal axis of FIG. 15 correspond to defect levels, and the thermally-stimulated current intensities of the vertical axis correspond to the defect densities.

Figure 17:
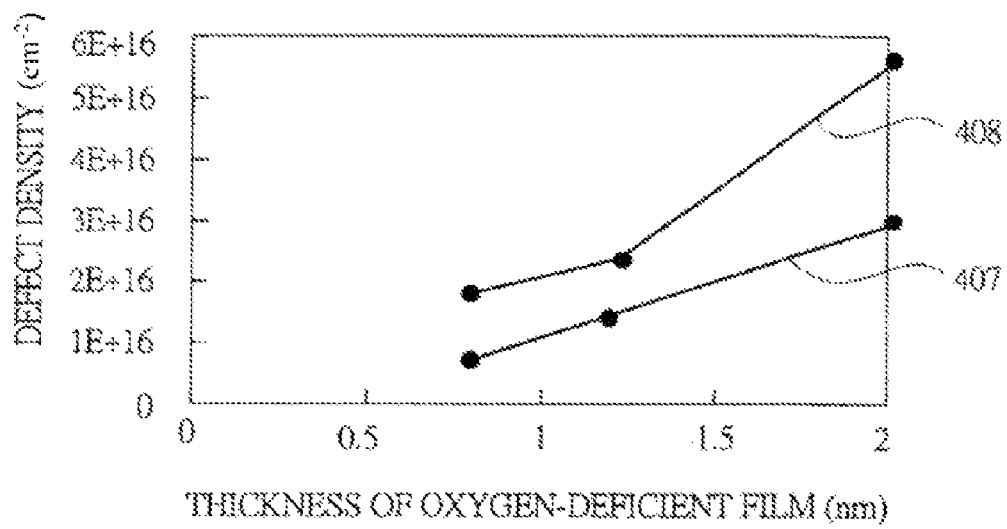
FIG. 17 is a graph illustrating a correlation between the film thickness of the oxygen-deficient film and the defect density.

As illustrated in FIG. 15, it can be understood that a peak 405 and a peak 406 caused by two types of defects can be observed in the curves 401 402, and 403. More specifically, it can be understood that a defect level corresponding to the peak 405 and a defect level corresponding to the peak 406 are formed in the film. The densities of the defects can be calculated from the intensities of the peak 405 and the peak 406. FIG. 17 illustrates a correlation between the defect density of the defects that provide the peak 405 and the defect density of the defects that provide the peak 406 and the film thicknesses of the oxygen-deficient films calculated in FIG. 14. In FIG. 17, the horizontal axis is a film thickness of the oxygen-deficient film, and the vertical axis is a defect density. A curve 407 shown in FIG. 17 illustrates the correlation between the defect density of the defects that provide the peak 405 and the film thickness of the oxygen-deficient film. Similarly, a curve 408 shown in FIG. 17 illustrates a correlation between the defect density of the defects that provide the peak 406 and the film thickness of the oxygen-deficient film.

The curve 407 illustrated in FIG. 17 can be generated in the following manner. According to the curves 401, 402, and 403 illustrated in FIG. 15, the defect densities of the defects that provide the peak 405 can be calculated from the thermally-stimulated current intensities. The curves 401, 402, and 403 represent the samples in which the silicon oxide films are formed by the hydrogen/oxygen method, the water vapor method, and the dry method, respectively, and the film thicknesses of the oxygen-deficient films which are generated when the silicon oxide films are formed by the respective methods are found out from FIG. 14. Therefore, corresponding to the curves 401, 402, and 403, three points (plot points of FIG. 17) at which the film thicknesses and the defect densities of the oxygen-deficient films are specifically provided can be obtained. When the three points are mutually connected, the curve 407 can be obtained. Similarly, the curve 408 illustrated in FIG. 17 can be also obtained.

As illustrated in FIG. 17, the curve 407 is substantially straight; therefore, it can be understood that the defects that provide the peak 405 are present in the oxygen-deficient film. More specifically, when defects are generated in the oxygen-deficient film, the thicker the film thickness of the oxygen-deficient film is, the higher the defect density becomes; therefore, when the relation between the film thickness of the oxygen-deficient film and the defect density is linear, it can be determined that the defects are generated in the oxygen-deficient film. On the other hand, as is understood from the curve 408, the defect density of the defects that provide the peak 406 does not show good correlation with the film thickness of the oxygen-deficient film. Accordingly, this means that the defects that provide the peak 406 are not present only in the oxygen-deficient film, but also present in the silicon oxide film formed above the oxygen-deficient film.

However, it is already known that the defect level that provides the peak 405 deteriorates the charge retention characteristics of the non-volatile memory cell more than the defect level that provides the peak 406; therefore, suppressing the generation of the defects that provide the peak 405 is important from the viewpoint of improving the charge retention characteristics of the non-volatile memory cell. It is already known that the defects that provide the peak 405 tend to be generated in the oxygen-deficient film as described above; therefore, suppressing the defects generated in the oxygen-deficient film is necessary from the viewpoint of improving the charge retention characteristics of the non-volatile memory cell. According to the above verification results, it can be understood that the defects that adversely affect the charge retention characteristics are generated in the oxygen-deficient film when the non-volatile memory cell undergoes 5000 times of rewrites.

Next, a nitrogen introducing step and a thermal re-oxidation step which are steps of suppressing the defects generated in the oxygen-deficient film and characteristic steps of the present embodiment will be described.

Figure 18:
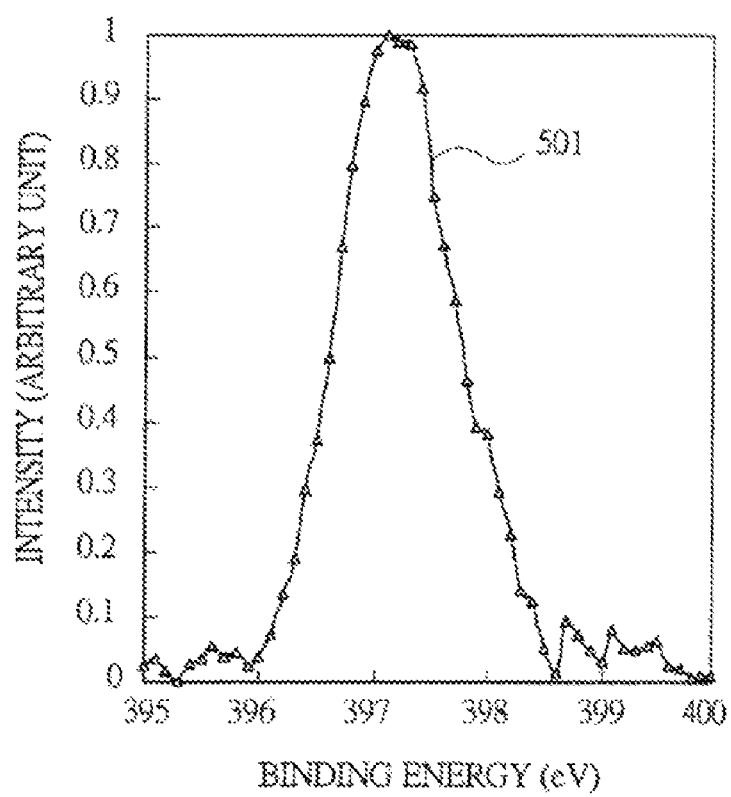
FIG. 18 is a graph illustrating a result of a measurement of the state, in which nitrogen atoms are introduced to the interface of the semiconductor substrate, by the X-ray photoelectron spectroscopy.

First, the state of the nitrogen atoms introduced to the interface of the semiconductor substrate by the nitrogen introducing step will be described. FIG. 18 is a graph illustrating a relation between the binding energy and the intensity of the 1S orbital of the nitrogen atoms. More specifically, a curve 501 of FIG. 18 is a result of an evaluation of the 1S orbital of the nitrogen atoms introduced into the interface of the semiconductor substrate by the X-ray photoelectron spectroscopy. The height of the peak corresponds to the amount of the nitrogen atoms, and the binding energy at which the peak is generated corresponds to the chemical bonding state of the nitrogen atoms. It can be understood that, according to the height of the peak, the amount of the nitrogen atoms is 5% with respect to the amount of the silicon atoms disposed on the surface first layer of the semiconductor substrate. Furthermore, according to the position of the binding energy at which the peak is generated, it can be understood that the nitrogen atoms are not bonded with oxygen atoms, but are bonded only with the silicon atoms which constitute the semiconductor substrate. More specifically, the nitrogen atoms introduced in the nitrogen introducing step of the present embodiment are chemically bonded only with silicon atoms; therefore, it can be understood that the nitrogen atoms can be localized at the interface of the semiconductor substrate.

Figure 19:
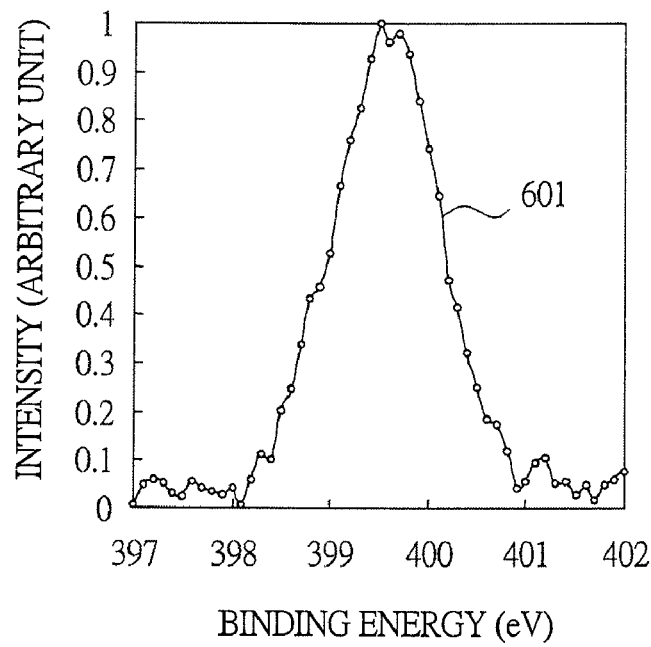
FIG. 19 is a graph illustrating a result of a measurement of the state of the nitrogen atoms by the X-ray photoelectron spectroscopy after a thermal re-oxidation is carried out.

Subsequently, a thermal re-oxidation step, which is carried out after the nitrogen introducing step, will be described. In order to verify the formation of the silicon oxynitride film by the thermal re-oxidation, a measurement by the X-ray photoelectron spectroscopy as illustrated in FIG. 19 was carried out. More specifically, FIG. 19 is a graph illustrating a relation between the binding energy and the intensity of the 1S orbital of the nitrogen atoms.

Figure 20:
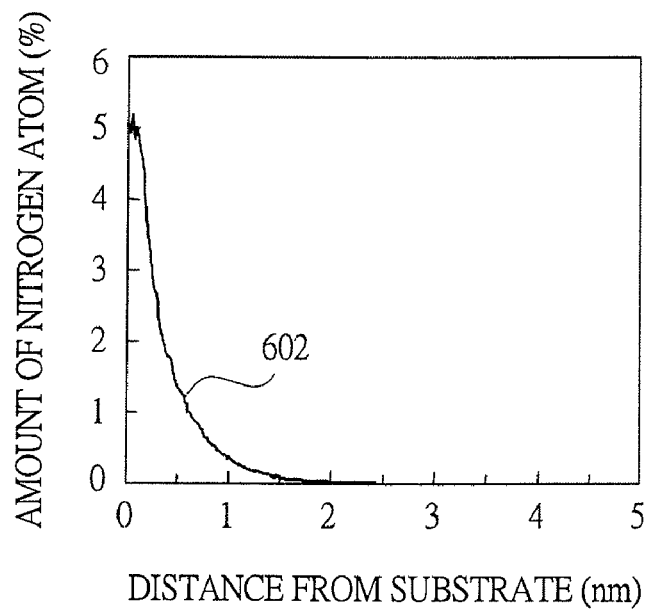
FIG. 20 is a graph illustrating a result of a measurement of the distribution of the nitrogen atoms in the film thickness direction by SIMS after the thermal re-oxidation is carried out.

As illustrated in FIG. 19, according to the value of the binding energy at which the peak of a curve 601 is generated, it can be understood that nitrogen atoms are bonded with oxygen atoms. More specifically, the nitrogen atoms are reacted with the oxygen atoms contained in the oxygen-deficient film and forming a stable silicon oxynitride film. Furthermore, the sample used in the measurement was subjected to SIMS, and the distribution of the nitrogen atoms in the film thickness direction was measured. A result thereof is illustrated in FIG. 20. FIG. 20 is a graph illustrating a relation between the distance from the semiconductor substrate and the amount of the nitrogen atoms. As shown by a curve 602 of FIG. 20, it can be understood that the amount of nitrogen atoms is about 5% (the value with respect to the amount of the silicon atoms disposed on the surface first layer of the semiconductor substrate) at the interface of the semiconductor substrate, the amount of the nitrogen atoms gradually decreases as the distance increases toward an upper layer and away from the interface of the semiconductor substrate, and the amount of the nitrogen atoms becomes substantially zero when the distance from the semiconductor substrate reaches about 2 nm.

Herein, the oxygen-deficient film is formed on the interface of the semiconductor substrate, and the film thickness of the oxygen-deficient film is about 2 nm or less as described above. Therefore, it can be understood that the nitrogen atoms are introduced into the oxygen-deficient film and substitute the film with the silicon oxynitride film. In addition, it can be understood that, since the amount of the nitrogen atoms is substantially zero at the point distant from the interface of the semiconductor substrate by 2 nm or more, the silicon oxide film formed on the oxygen-deficient film is not substituted with a silicon oxynitride film. Thus, it can be understood that, when the amount of distribution of the nitrogen atoms is configured to have an inclination in the film-thickness direction, the oxygen-deficient film being present at the interface of the semiconductor substrate can be mainly substituted with the silicon oxynitride film.

According to the foregoing, it can be understood that the oxygen-deficient film being present at the interface of the semiconductor substrate can be sufficiently substituted with the silicon oxynitride film; meanwhile, substitution of the silicon oxide film being present above the oxygen-deficient film with the silicon oxynitride film can be suppressed by the nitrogen introducing step and the thermal re-oxidation step carried out in the present embodiment.

Figure 21:
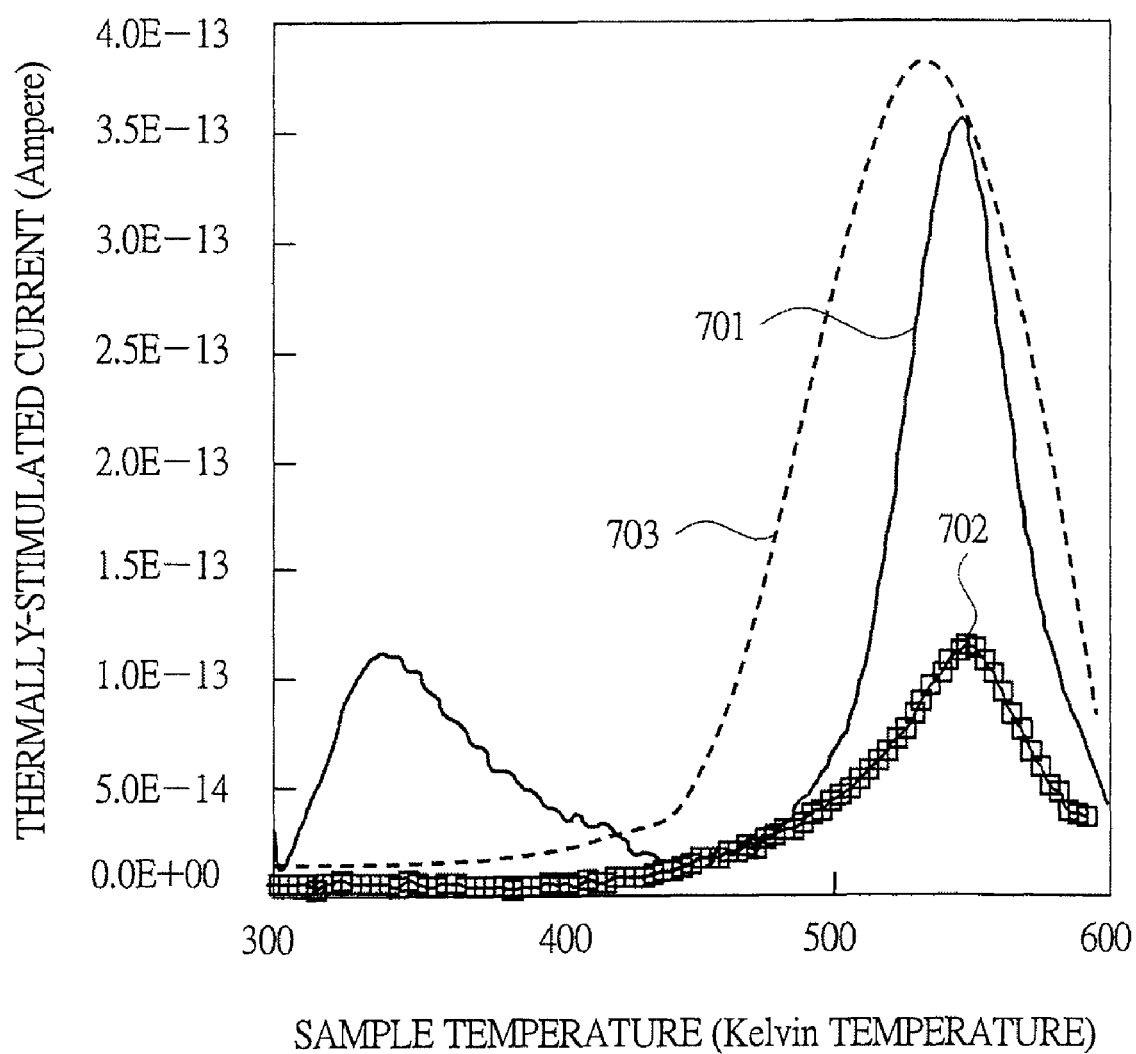
FIG. 21 is a graph illustrating results of a measurement of the thermally-stimulated currents with respect to samples before and after the thermal re-oxidation.

Next, a sample to which the thermal re-oxidation of forming the silicon oxynitride film was applied and a sample to which the thermal re-oxidation was not applied were subjected to thermally-stimulated current measurements. Results thereof are shown in FIG. 21. FIG. 21 is a graph illustrating a relation between sample temperatures and thermally-stimulated currents. The measurement conditions thereof are equivalent to those of FIG. 15. In FIG. 21, a curve 701 represents the sample to which the thermal re-oxidation was not applied; and, in this sample, the oxygen-deficient film of merely 1.5 nm is formed between the semiconductor substrate and the silicon oxide film. A curve 702 was measured by the sample after the thermal re-oxidation was carried out; and, in this sample, the silicon oxynitride film of merely 1.5 nm is formed between the semiconductor substrate and the silicon oxide film. A curve 703 was measured by the sample treated under harsh conditions, wherein the temperature at the time of thermal re-oxidation was 1150° C. and was higher than the optimal temperature condition of the present embodiment; and, in this sample, the silicon oxynitride film of merely 3 nm is formed between the semiconductor substrate and the silicon oxide film. The film thicknesses of the silicon oxynitride film are the values evaluated by the X-ray reflectivity similar to that in FIG. 13.

As is understood from FIG. 21, as compared with the curve 701, the peak in the low-temperature side is eliminated in the curve 702, and the peak intensity thereof in the high-temperature side is significantly lowered. This is conceivably for the reason that the oxygen-deficient film is reduced by formation of the silicon oxynitride film. In the present measurement method, the intensity of a peak is proportional to the defect density; therefore, reduction of the peak intensity means that the defect intensity is reduced. Therefore, in the sample that provides the curve 702 (the sample which has undergone the nitrogen introducing step and the thermal re-oxidation step), the defect density is reduced. This means that leakage of electrons accumulated in the charge storage film (silicon nitride film) formed above the silicon oxide film can be suppressed, and an improvement of the charge retention characteristics can be expected.

Meanwhile, in the curve 703, although the peak in the low-temperature side is eliminated, the peak in the high-temperature side is increased more than the curve 701. This means that the defect density is increased in the sample that provides the curve 703. In this sample, the film thickness of the silicon oxynitride film is as thick as 3 nm. This means that a part of the silicon oxide film formed above the oxygen-deficient film is also nitrided and converted to the silicon oxynitride film, in addition to the conversion of the oxygen-deficient film to the silicon oxynitride film.

Generally, the silicon oxynitride film is known for a higher defect density than the silicon oxide film. Therefore, in the sample that provides the curve 703, the defect density is determined by the balance of both the effect of reducing the defect density by a conversion of the oxygen-deficient film to the silicon oxynitride film and the effect of increasing the defect density by a conversion of even a part of the silicon oxide film to the silicon oxynitride film. Thus, nitridation of the silicon oxide film increases the defect density more than nitridation of merely the oxygen-deficient film. It is understood that, as a result, the defect density is increased in the curve 703 compared with the curve 702.

Thus, in the sample that provides the curve 702, leakage of electrons, which have been injected into the charge storage film (silicon nitride film), to the semiconductor substrate is suppressed as compared with the sample that provides the curve 701; therefore, the charge retention characteristics (memory retention characteristics) of the non-volatile memory cell is improved. On the other hand, in the sample that provides the curve 703, reversely, it is expected that the leakage of electrons is promoted and the charge retention characteristics are deteriorated. In the sample that provides the curve 702 (the sample in which the silicon oxynitride film has a film thickness of 1.5 nm), although the oxygen-deficient film is eliminated, the silicon oxide film being present thereabove is not nitrided and is unchanged. On the other hand, in the sample that provides the curve 703 (the sample in which the silicon oxynitride film has a thickness of 3 nm), although the oxygen-deficient film is eliminated, the silicon oxide film being present thereabove is also nitrided. Therefore, from the viewpoint of improving the charge retention characteristics of the non-volatile memory cell, which is an object of the present embodiment, the film thickness of the silicon oxynitride film is desirably in the state in which the silicon oxide film is not nitrided and merely the oxygen-deficient film is nitrided. Specifically, the film thickness of the silicon oxynitride film is desirably 0.5 nm or more and 2 nm or less.

Figure 22:
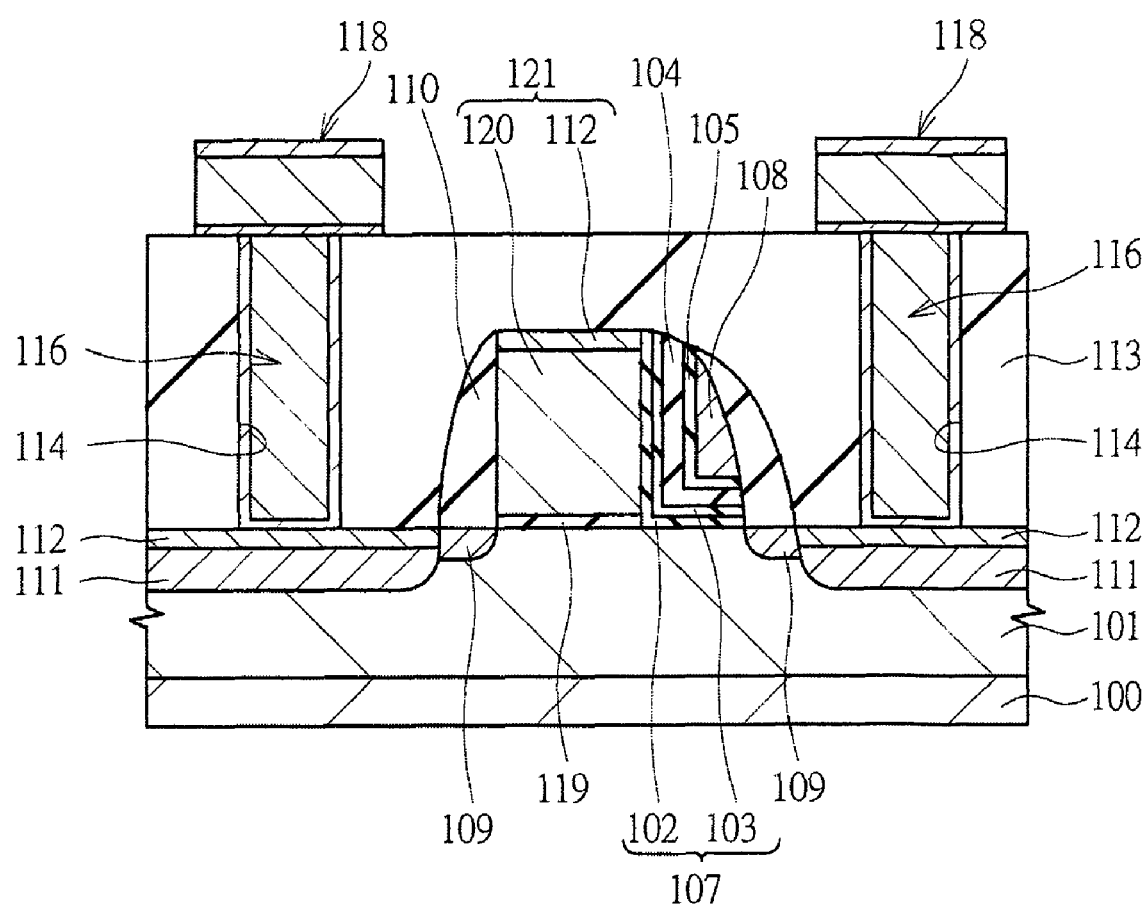
FIG. 22 is a cross-sectional view illustrating a structure of a non-volatile memory cell of a modification example of the embodiment.

Next, a modification example of the present embodiment will be described. FIG. 22 is a cross-sectional view illustrating a structure of a non-volatile memory cell of the modification example. As illustrated in FIG. 22, the non-volatile memory cell of the modification example is a split-gate-type transistor in which a select transistor of selecting a cell and a memory transistor of storing information are integrated.

In FIG. 22, the p-type well 101 is formed on the semiconductor substrate 100, and the non-volatile memory cell is formed on the p-type well 101. The non-volatile memory cell includes a selecting part, which selects a memory cell, and a storage part, which stores information. First, the constitution of the selecting part, which selects the memory cell, will be described. The non-volatile memory cell has a gate insulating film 119 formed on the semiconductor substrate 100 (p-type well 101), and a control gate electrode (control electrode) 121 is formed on the gate insulating film 119. The gate insulating film 119 is formed of, for example, a silicon oxide film, and the control gate electrode 121 is formed of, for example, a polysilicon film 120 and the cobalt silicide film 112 formed on the polysilicon film 120. The cobalt silicide film 112 is formed for reducing the resistance of the control gate electrode 121. The control gate electrode 121 has the function of selecting a non-volatile memory cell. More specifically, a particular non-volatile memory cell is selected by the control gate electrode 121, so as to subject the selected non-volatile memory cell to the write operation, the erase operation, or the read operation.

Next, the constitution of the storage part of the non-volatile memory cell will be described. On one of the sidewalls of the control gate electrode 121, the gate electrode (memory gate electrode) 108 is formed via a stacked film formed of an insulating film(s). The gate electrode 108 has a shape as a sidewall formed on one of the sidewalls of the control gate electrode 121 and is formed of a polysilicon film and a cobalt silicide film (not shown) formed on the polysilicon film. The cobalt silicide film is formed for reducing the resistance of the gate electrode 108.

The stacked film is formed between the control gate electrode 121 and the gate electrode 108 and between the gate electrode 108 and the semiconductor substrate 100. The stacked film includes the tunnel silicon oxide film 107 formed on the semiconductor substrate 100, the silicon nitride film (charge storage film) 104 formed on the tunnel silicon oxide film 107, and the silicon oxide film 105 formed on the silicon nitride film 104. The tunnel silicon oxide film 107 functions as a tunnel insulating film. For example, in the storage part of the non-volatile memory cell, in order to store or erase information by injecting electrons or injecting holes into the silicon nitride film 104, which is the charge storage film, from the semiconductor substrate 100 via the tunnel silicon oxide film 107, the tunnel silicon oxide film 107 functions as the tunnel insulating film.

Also in the modification example, when the tunnel silicon oxide film 107 is composed of only a silicon oxide film, an oxygen-deficient film in which oxygen is stoichiometrically deficient is formed at the interface between the semiconductor substrate 100 and the silicon oxide film. Then, as is explained in the above described embodiment, when the non-volatile memory cell is repeatedly driven, a lot of defects are formed in the oxygen-deficient film, and the charges accumulated in the silicon nitride film 104, which is the charge storage film, is leaked to the semiconductor substrate 100 via the defects. Therefore, the problem of deterioration of the charge retention characteristics of the non-volatile memory cell also occurs in the non-volatile memory cell of the modification example.

Therefore, also in the modification example, forming the tunnel silicon oxide film 107 by the stacked film of the silicon oxynitride film 102 and the silicon oxide film 103 is effective. Also in the modification example, as with the above-described embodiment, it is configured such that the density of the nitrogen atoms contained in the silicon oxynitride film 102 decreases as the distance from the interface of the semiconductor substrate 100 increases in the film-thickness direction of the silicon oxynitride film 102.

Consequently, the oxygen-deficient film being present at the interface of the semiconductor substrate 100 can be sufficiently substituted with the silicon oxynitride film 102; meanwhile, substitution of the silicon oxide film 103, which is present above the oxygen-deficient film, with the silicon oxynitride film 102 can be suppressed. More specifically, the silicon oxynitride film 102 has a lower defect density than that of the oxygen-deficient film; however, the defect density thereof is higher than that of the silicon oxide film 103. Therefore, when it is configured such that the density of nitrogen atoms contained in the silicon oxynitride film 102 decreases as the distance from the interface of the semiconductor substrate 100 increases in the film-thickness direction of the silicon oxynitride film 102, the oxygen-deficient film being present at the interface of the semiconductor substrate 100 can be substituted with the silicon oxynitride film 102 so as to reduce the defect density, and the increase in the defect density that is caused when the silicon oxide film 103 is substituted with the silicon oxynitride film 102 can be suppressed. Thus, also in the non-volatile memory cell of the modification example, the charge retention characteristics can be improved.

Next, among the sidewalls of the control gate electrode 121, the gate electrode 108 is formed on one side, and, the sidewall spacer 110 comprising a silicon oxide film is formed on the other side. Similarly, among the sidewalls of the gate electrode 108, the control gate electrode 121 is formed on one side, and, the sidewall spacer 110 formed of the silicon oxide film is formed on the other side thereof.

In the semiconductor substrate 100 immediately below the sidewall spacers 110, a pair of shallow low-concentration n-type impurity diffusion regions 109 are formed, and a pair of deep n-type impurity diffusion regions 111 are formed in the outside regions which are in contact with the pair of shallow low-concentration n-type impurity diffusion regions 109. The cobalt silicide film 112 is formed on the surface of the high-concentration n-type impurity diffusion regions 111. A source region or a drain region of the non-volatile memory cell is formed by the pair of the low-concentration n-type impurity diffusion region 109 and the pair of the high-concentration n-type impurity diffusion region 111. When the source region and the drain region are formed by the low-concentration n-type impurity diffusion regions 109 and the high-concentration n-type impurity diffusion regions 111, the source region and drain region can have the LDD (Lightly Doped Drain) structure. Herein, the transistor including the gate insulating film 119, the control gate electrode 121 formed on the gate insulating film 119, and the above-described source region and the drain region is referred to as a select transistor. Meanwhile, a transistor including: the stacked film formed of the tunnel silicon oxide film 107, the charge storage film 104, and the silicon oxide film 105; the gate electrode 108 formed on the laminated films; and the above-described source region and the drain region is referred to as a memory transistor. Thus, it can be said that the selecting part of the non-volatile memory cell is composed of the selective transistor, and the storage part of the non-volatile memory cell is composed of the memory transistor.

In the foregoing, the invention made by the inventors of the present invention has been concretely described based on the embodiments. However, it is needless to say that the present invention is not limited to the foregoing embodiments and various modifications and alterations can be made within the scope of the present invention.

INDUSTRIAL APPLICABILITY

The present invention can be widely utilized in the manufacturing industry that manufactures semiconductor devices.

The invention claimed is:

1. A method of manufacturing a non-volatile semiconductor memory device comprising the steps of:
   (a) forming a tunnel silicon oxide film on a semiconductor substrate;
   (b) converting a part of the tunnel silicon oxide film in contact with the semiconductor substrate to a silicon oxynitride film after the step (a);
   (c) forming a charge storage film on the tunnel silicon oxide film;
   (d) forming a gate insulating film on the charge storage film;
   (e) forming a conductive film on the gate insulating film;
   (f) forming a gate electrode by patterning the conductive film and processing the gate insulating film, the charge storage film, the tunnel silicon oxide film, and the silicon oxynitride film in conformity with the gate electrode; and
   (g) forming a source region and a drain region of the non-volatile semiconductor memory device,
   wherein the step (b) includes the steps of:
   (b1) introducing nitrogen atoms into an interface of the semiconductor substrate and the tunnel silicon oxide film by a first thermal treatment in an atmosphere containing nitrogen monoxide; and
   (b2) diffusing the nitrogen atoms in a film-thickness direction of the tunnel silicon oxide film to form the silicon oxynitride film after the step (b1) by a second thermal treatment in an atmosphere containing oxygen.

2. The method of manufacturing the non-volatile semiconductor memory device according to claim 1,
   wherein a density of nitrogen atoms contained in the silicon oxynitride film decreases as a distance from an interface of the semiconductor substrate increases in a film-thickness direction of the silicon oxynitride film.

3. The method of manufacturing the non-volatile semiconductor memory device according to claim 1,
   wherein the first thermal treatment carried out at the step (b1) is a thermal treatment in an atmosphere having a nitrogen monoxide concentration of 100%.

4. The method of manufacturing the non-volatile semiconductor memory device according to claim 1,
   wherein the first thermal treatment carried out at the step (b1) is a thermal treatment carried out at a temperature of the second thermal treatment is 900° C. or more and 1100° C. or less.

5. The method of manufacturing the non-volatile semiconductor memory device according to claim 1,
   wherein the second thermal treatment carried out at the step (b2) is a thermal treatment in an atmosphere having an oxygen concentration of 50% or more and 100% or less, and a temperature of the second thermal treatment is 900° C. or more and 1100° C. or less.

6. The method of manufacturing the non-volatile semiconductor memory device according to claim 1,
wherein a part of the tunnel silicon oxide film to be converted to the silicon oxynitride film is an oxygen-deficient film in which oxygen is stoichiometrically deficient, the oxygen deficient film being formed at the interface of the semiconductor substrate when the tunnel silicon oxide film is formed at the step (a).

* * * * *